United States Patent
Hendrix et al.

(10) Patent No.: US 11,131,794 B2
(45) Date of Patent: *Sep. 28, 2021

(54) OPTICAL FILTER AND SENSOR SYSTEM

(71) Applicant: VIAVI Solutions Inc., San Jose, CA (US)

(72) Inventors: Karen Denise Hendrix, Santa Rosa, CA (US); Richard A. Bradley, Jr., Santa Rosa, CA (US); Marius Grigonis, Santa Rosa, CA (US); Georg J. Ockenfuss, Santa Rosa, CA (US)

(73) Assignee: VIAVI Solutions Inc., San Jose, CA (US)

( * ) Notice: Subject to any disclaimer, the term of this patent is extended or adjusted under 35 U.S.C. 154(b) by 166 days.

This patent is subject to a terminal disclaimer.

(21) Appl. No.: 16/290,612

(22) Filed: Mar. 1, 2019

(65) Prior Publication Data

US 2019/0196072 A1 Jun. 27, 2019

Related U.S. Application Data

(63) Continuation of application No. 15/617,654, filed on Jun. 8, 2017, now Pat. No. 10,222,526, which is a
(Continued)

(51) Int. Cl.
*G02B 5/28* (2006.01)
*G01J 5/08* (2006.01)
(Continued)

(52) U.S. Cl.
CPC ............ *G02B 5/281* (2013.01); *C23C 14/08* (2013.01); *C23C 14/185* (2013.01);
(Continued)

(58) Field of Classification Search
CPC .......... G02B 5/281; G02B 1/115; G02B 1/11; G02B 5/207; G02B 5/285; C23C 14/5806;
(Continued)

(56) References Cited

U.S. PATENT DOCUMENTS 2,852,980 A 9/1958 Schroder
2,920,002 A 1/1960 Auwarter
(Continued)

FOREIGN PATENT DOCUMENTS

CN 1737190 A 2/2006
CN 1278457 C 10/2006
(Continued)

OTHER PUBLICATIONS

Bouizem Y., et al., "Optical and Structural Properties of Hydrogenated Silicon Films Prepared by rf-magnetron Sputtering at Low Growth Temperatures: Study as a Function of Argon Gas Diiution", Journal of Non-Crystalline Solids, 2012, vol. 358, pp. 854-859.
(Continued)

*Primary Examiner* — Michael C Bryant
(74) *Attorney, Agent, or Firm* — Harrity & Harrity, LLP

(57) ABSTRACT

An optical filter having a passband at least partially overlapping with a wavelength range of 800 nm to 1100 nm is provided. The optical filter includes a filter stack formed of hydrogenated silicon layers and lower-refractive index layers stacked in alternation. The hydrogenated silicon layers each have a refractive index of greater than 3 over the wavelength range of 800 nm to 1100 nm and an extinction coefficient of less than 0.0005 over the wavelength range of 800 nm to 1100 nm.

19 Claims, 14 Drawing Sheets

Related U.S. Application Data continuation of application No. 15/099,180, filed on Apr. 14, 2016, now Pat. No. 9,945,995, which is a continuation of application No. 13/943,596, filed on Jul. 16, 2013, now Pat. No. 9,354,369.

(60) Provisional application No. 61/672,164, filed on Jul. 16, 2012.

(51) Int. Cl.

| | |
|---|---|
| H04N 13/254 | (2018.01) |
| G02B 1/115 | (2015.01) |
| C23C 14/58 | (2006.01) |
| C23C 14/08 | (2006.01) |
| C23C 14/54 | (2006.01) |
| C23C 14/18 | (2006.01) |
| G02B 1/11 | (2015.01) |
| G02B 5/20 | (2006.01) |
| G06K 9/00 | (2006.01) |
| H04N 5/33 | (2006.01) |

(52) U.S. Cl.
CPC ........ *C23C 14/548* (2013.01); *C23C 14/5806* (2013.01); *G01J 5/0862* (2013.01); *G02B 1/11* (2013.01); *G02B 1/115* (2013.01); *G02B 5/207* (2013.01); *G02B 5/285* (2013.01); *G06K 9/00335* (2013.01); *H04N 5/33* (2013.01); *H04N 13/254* (2018.05)

(58) Field of Classification Search
CPC ..... C23C 14/08; C23C 14/548; C23C 14/185; H04N 13/254; H04N 5/33; G06K 9/00335; G01J 5/0862
See application file for complete search history.

(56) References Cited

U.S. PATENT DOCUMENTS

| | | |
|---|---|---|
| 3,514,174 A | 5/1970 | Gans et al. |
| 3,528,726 A | 9/1970 | Austin |
| 3,620,626 A | 11/1971 | Daly et al. |
| 3,781,111 A | 12/1973 | Fletcher et al. |
| 3,976,875 A | 8/1976 | Engstrom et al. |
| 3,996,461 A | 12/1976 | Sulzbach et al. |
| 4,518,670 A | 5/1985 | Matsuzaki et al. |
| 4,835,381 A | 5/1989 | Sorenson, III |
| 4,846,541 A | 7/1989 | Miura et al. |
| 4,854,670 A | 8/1989 | Mellor |
| 5,183,700 A | 2/1993 | Austin |
| 5,245,468 A | 9/1993 | Demiryont et al. |
| 5,258,618 A | 11/1993 | Noble |
| 5,372,874 A | 12/1994 | Dickey et al. |
| 5,398,133 A | 3/1995 | Tsai et al. |
| 5,472,787 A | 12/1995 | Johnson et al. |
| 5,605,609 A | 2/1997 | Ando et al. |
| 6,104,530 A | 8/2000 | Okamura et al. |
| 6,115,180 A | 9/2000 | Hirai et al. |
| 6,249,378 B1 | 6/2001 | Shimamura et al. |
| 6,323,942 B1 | 11/2001 | Bamji |
| 6,455,876 B1 | 9/2002 | Kikawa et al. |
| 6,572,975 B2 | 6/2003 | Dalakos et al. |
| 6,631,033 B1 | 10/2003 | Lewis et al. |
| 7,049,004 B2 | 5/2006 | Domash et al. |
| 7,133,197 B2 | 11/2006 | Ockenfuss et al. |
| 7,194,209 B1 | 3/2007 | Robbins et al. |
| 7,247,835 B2 | 7/2007 | Chang |
| 7,340,077 B2 | 3/2008 | Gokturk et al. |
| 7,567,382 B2 | 7/2009 | Shogaki et al. |
| 7,646,423 B2 | 1/2010 | Yoshida et al. |
| 7,859,754 B2 | 12/2010 | Falicoff |
| 7,879,209 B2 | 2/2011 | Tilsch et al. |
| 7,901,870 B1 | 3/2011 | Wach et al. |
| 7,993,700 B2 | 8/2011 | Zhou et al. |
| 8,080,776 B2 | 12/2011 | Kurahashi et al. |
| 8,163,144 B2 | 4/2012 | Tilsch et al. |
| 8,227,883 B2 | 7/2012 | Kasano et al. |
| 8,304,727 B2 | 11/2012 | Lee et al. |
| 8,461,533 B2 | 6/2013 | Findlay |
| 8,861,088 B2 | 10/2014 | Ohnishi |
| 9,077,868 B2 | 7/2015 | Pilgrim |
| 9,098,931 B2 | 8/2015 | Shpunt et al. |
| 9,322,965 B2 | 4/2016 | Osawa et al. |
| 9,354,369 B2 | 5/2016 | Hendrix et al. |
| 9,488,827 B2 | 11/2016 | Fukuyo et al. |
| 9,588,269 B2 | 3/2017 | Hendrix et al. |
| 9,945,995 B2 | 4/2018 | Hendrix et al. |
| 10,222,526 B2 | 3/2019 | Hendrix et al. |
| 2002/0080493 A1 | 6/2002 | Tsai et al. |
| 2002/0154387 A1 | 10/2002 | Mori et al. |
| 2003/0072009 A1 | 4/2003 | Domash et al. |
| 2004/0001182 A1 | 1/2004 | Dyner et al. |
| 2005/0018192 A1 | 1/2005 | DiFoggio et al. |
| 2005/0098713 A1 | 5/2005 | Holland et al. |
| 2006/0171698 A1 | 8/2006 | Ryu et al. |
| 2007/0024779 A1 | 2/2007 | Sharp et al. |
| 2008/0006762 A1 | 1/2008 | Fadell et al. |
| 2008/0013178 A1 | 1/2008 | Terada |
| 2008/0055716 A1 | 3/2008 | Erdogan et al. |
| 2008/0105298 A1 | 5/2008 | Lu et al. |
| 2008/0223436 A1 | 9/2008 | Den Boer et al. |
| 2009/0002830 A1 | 1/2009 | Okamoto et al. |
| 2009/0015153 A1 | 1/2009 | Asano |
| 2010/0010773 A1 | 1/2010 | Lin et al. |
| 2010/0039707 A1 | 2/2010 | Akahane et al. |
| 2010/0284088 A1 | 11/2010 | Zambov et al. |
| 2010/0309555 A1 | 12/2010 | Southwell et al. |
| 2011/0232745 A1 | 9/2011 | Alves et al. |
| 2011/0301500 A1 | 12/2011 | Maguire et al. |
| 2011/0310472 A1 | 12/2011 | Hirai et al. |
| 2012/0056988 A1 | 3/2012 | Stanhill et al. |
| 2012/0099188 A1 | 4/2012 | Akozbek et al. |
| 2012/0145901 A1 | 6/2012 | Kakiuchi et al. |
| 2012/0182392 A1 | 7/2012 | Kearns et al. |
| 2012/0187512 A1 | 7/2012 | Wang et al. |
| 2012/0224061 A1 | 9/2012 | Pilgrim |
| 2012/0268809 A1 | 10/2012 | Guo et al. |
| 2012/0326191 A1 | 12/2012 | Fu |
| 2013/0224521 A1 | 8/2013 | Wang et al. |

FOREIGN PATENT DOCUMENTS

| | | |
|---|---|---|
| CN | 1892676 A | 1/2007 |
| CN | 1996074 A | 7/2007 |
| CN | 101030013 A | 9/2007 |
| CN | 101183663 B | 5/2008 |
| CN | 101389982 A | 3/2009 |
| CN | 101421641 A | 4/2009 |
| CN | 101660131 A | 3/2010 |
| CN | 1737190 B | 5/2012 |
| CN | 102455779 A | 5/2012 |
| CN | 203786316 U | 8/2014 |
| CN | 203849441 U | 9/2014 |
| CN | 104471449 B | 5/2018 |
| EP | 1816677 A1 | 8/2007 |
| EP | 1879058 A2 | 1/2008 |
| EP | 2872935 B1 | 8/2018 |
| JP | 2005025020 A | 1/2005 |
| JP | 2011085959 A | 4/2011 |
| JP | 2011100084 A | 5/2011 |
| KR | 10-2006-0088189 A | 8/2006 |
| KR | 20100061371 A | 6/2010 |
| KR | 20100128119 A | 12/2010 |
| KR | 10-1821116 | 1/2018 |
| KR | 101821116 B1 | 1/2018 |
| KR | 10-1821116 | 3/2019 |
| TW | 548232 B | 8/2003 |
| TW | 201003417 A | 1/2010 |
| TW | 201003477 A | 1/2010 |
| TW | 201225637 A | 6/2012 |
| TW | I576617 B | 4/2017 |

(56) References Cited

FOREIGN PATENT DOCUMENTS

| TW | I648561 B | 1/2019 |
|---|---|---|
| TW | I684031 B | 2/2020 |
| WO | 2011089931 A1 | 7/2011 |

OTHER PUBLICATIONS

Chunling L., et al., "Process Investigation of a-Si:H Thin Films Prepared by DC Magnetron Sputtering", Proceedings of SPIE 6825, Lasers in Material Processing and Manufacturing III, Jan. 2008, vol. 6825, pp. 682514(1-8).
Dao-Zhong Z., et al., "The Reflective Properties of Broadband Optical Multilayers", Acta Physica Sinica, May 1997, vol. 6(5), pp. 372-381.
Demichelis F., et al., "Optical Properties of Hydrogenated Amorphous Silicon", Journal of Applied Physics, 1986, vol. 59, pp. 611-618.
Dobrowolski J. A., "Handbook of Optics I: Part 11, Chapter 42: Optical Properties of Films and Coatings", 1995, 129 pages.
Domash L., et al., "Tunable and Switchable Multiple-Cavity Thin Film Filters", Journal of Lightwave Technology, 2004, vol. 22 (1), pp. 126-135.
Houssain M., et al., "Characterization of Hydrogenated Amorphous Silicon Thin Films Prepared by Magnetron Sputtering", Journal of Non-Crystalline Solids, 2006, vol. 352, pp. 18-23.
Hsu K.-C., et al., "Evolution of Microstructures in Hydrogenated Silicon Films Prepared by Diluted-hydrogen and Hydrogen-atom-treatment Methods", Journal of Applied Physics, May 15, 1993, vol. 73(10), pp. 4841-4847.
Martin P. M., et al., "Sputtered Si:H Alloys for Edge Filters: Application to Thermophotovoltaics", Applied Optics, Nov. 1, 2002, vol. 41(31), pp. 6702-6707.
McKenzie D.R., et al., "Optical Properties of a-Si and a-Si:H Prepared by DC Magnetron Techniques", Journal of Physics C: Solid State Physics, 1983, vol. 16, pp. 4933-4944.
McMillan J.A., et al., "Kinetics of Deposition of Amorphous Hydrogenated Silicon Films", Journal of Applied Physics, 1979, vol. 50(8), pp. 5238-5241.
Netrvalova M., et al., "Structure and Optical Properties of the Hydrogen Diluted a-Si:H Thin Films Prepared by PECVD With Different Composition Temperatures", The Eighth International Conference on Advanced Semiconductor Devices and Microsystems, IEEE, 2010, pp. 329-332.
Peng L., et al., "Optical Filter on the Window on 0-25 Degree Incidence Angle 980nm Semiconductor Detector", Academic Symposium on Optoelectronics and Microelectronics Technology and 10th Chinese-Russian Symposium on Laser Physics and Laser Technology Optoelectronics Technology (ASOT), IEEE, 2010, pp. 109-111.
Rancourt J.D., "Optical Thin Films: User Handbook" 1996, 298 pages.
Ross R.C., et al., "Microstructure and Properties of rf-sputtered Amorphous Hydrogenated Silicon Films", Journal of Applied Physics, Aug. 1981, vol. 52(8), pp. 5329-5339.
Savvides N., "Deposition Parameters and Film Properties of Hydrogenated Amorphous Silicon Prepared by High Rate DC Planar Magnetron Reactive Sputtering", Journal of Applied Physics, Jun. 15, 1984, vol. 55(12), pp. 4232-4238.
Scobey M., et al., "Stable Ultranarrow Bandpass Filters", Proceedings of SPIE, Optical Thing Films IV: New Developments, Sep. 7, 1994, vol. 2262, pp. 37-46.
Shirafuji S., et al., "Effect of Hydrogen Dilution of Silane on Optoelectronic Properties in Glow-discharged Hydrogenated Silicon Films", Journal of Applied Physics, 1985, vol. 58(9), pp. 3661-3663.
Shuaib A., et al., "Sputtered Hydrogenated Amorphous Silicon Thin Films for Distributed Bragg Reflectors and Long Wavelength Vertical Cavity Surface Emitting Lasers and Applications", Thin Solid Films, 2011, vol. 519, pp. 6178-6182.
Willey R.R., "Practical Design of Optical Thin Films", 2nd Edition, 2007, 560 page.
Yoda H., et al., "Rugate Filters Fabricated by a Radio Frequency Magnetron Sputtering System by Use of an Optical in Situ Monitoring Technique", Applied Optics, Jan. 1, 2006, vol. 45(1), pp. 184-190.
Extended European Search Report for Application No. EP18190864.1, dated Mar. 11, 2019, 8 pages.
Extended European Search Report for Application No. EP18190865.8, dated Mar. 11, 2019, 9 pages.
Documentary evidence provided by a Third Party Observation with respect to EP2872935 mailed on Jan. 17, 2017, 51 pages.
Tsai R.Y., et al., "Amorphous Silicon and Amorphous Silicon Nitride Films Prepared by a Plasma-Enhanced Chemical Vapor Deposition Process as Optical Coating Materials," Applied Optics, Oct. 1993, vol. 32 (28), pp. 5561-5566.
Yoda H., et al., "a-Si:H/SiO2 Multilayer Films Fabricated by Radio-Frequency Magnetron Sputtering for Optical Filters," Applied Optics, Jun. 2004, vol. 43 (17), pp. 3548-3554.
Pan Zhen, et al., "Study on Properties of a-Si: H Films Deposited by Magnetron Sputtering," Key Laboratory of Silicate Materials Science and Engineering, Ministry of Education, Wuhan University of Technology, ACTA Phonotica Sinica, vol. 37, Sup. 1, pp. 128-130. English Translation of Abstract only.
Extended European Search Report for Application No. EP13819621.7, dated Feb. 16, 2016, 5 pages.
George M., et al., "Silicon Nitride Arc Thin Films by New Plasma Enhanced Chemical Vapor Deposition Source Technology,"Photovoltaic Specialists Conference, 2008, 5 pages.
Gibbons et al., "Development and Implementation of a Hydrogenated a-Si Reactive Sputter Deposition Process," Proceedings of the Annual Technical Conference, Society of Vacuum Coaters, 2007, vol. 50, pp. 327-330.
International Search Report for International Application No. PCT/US2013/050710, dated Jan. 9, 2014, 2 pages.
Lairson B.M., et al., "Reduced Angle-Shift Infrared Bandpass Filter Coatings," Proceedings of the SPIE, 2007, vol. 6545, pp. 65451C-1-65451C-5.
Macleod H.A., "Thin-Film Optical Filters," Third Edition, Institute of Physics Publishing, Dec. 31, 2001, pp. 283-287.
Rienstra J.L., "Transformation of Filter Transmission Data for f-Number and Chief Ray Angle," Proceedings vol. 3377, Infrared Imaging Systems: Design, Analysis, Modeling, and Testing IX, Mar. 1998, 11 pages.
Macleod, Angus, "Thin Film Optical Filters", 1985, 2nd Ed. Chapter 7: Band-pass filters, Macmillan Publishing Company, New York, Adam Hilger Ltd. Bristol, pp. 234-313.
Macleod, Angus, "Thin Film Optical Filters", 2001, 3rd Ed., Oblique incidence, Macmillan Publishing Company, New York, Adam Hilger Ltd. Bristol, p. 23-27.
Lee, Cheng-Chung, "Thin Film Optics and Film Coating Technology", 2002, third edition, Chapter 8: band pass filter' Yi Hsien Publishing Co., Ltd, Taipei.
Cheng-Chung Lee, "Thin Film Optics and Film Coating Technology", 2002, third edition, Chapter 2, Section 2.3.4: Oblique incidence, Yi Hsien Publishing Co., Ltd, Taipei.
Lee, Cheng-Chung, "Thin Film Optics and Film Coating Technology", 2002, third edition, Chapter 8, Section 8.3.1, p. 236: The effect of the oblique incidence, Yi Hsien Publishing Co., Ltd, Taipei.
Tang, Jin-Fa et al., "Modem Optical Thin Film Technology", 2006, Section 3.5: Band pass filter, Zhejiang University Press, Hangzhou.
Tang, Jin-Fa et al., "Modem Optical Thin Film Technology", 2006, Section 1.3.1, p. 20, Zhejiang University Press, Hangzhou.
Bergman, David J., "The dielectric constant of a composite material—A problem in classical physics" Physics Reports, 43 (9), Jul. 1978, pp. 377-407.
Agranovich, V. M. et al., "Notes on Crystal Optics of Superlattices", Solid State Communication. 1985, 55, pp. 85-90.
Wood, B., et al., "Directed subwavelength imaging using a layered metal-dielectric system", Phys. Rev. B 74, 2006, p. 115116.

(56) References Cited

OTHER PUBLICATIONS

Yu, Huacong et al., "Study of hydrogenated nanoamorphous silicon (na—Si:H) thin film prepared by RF magnetron sputtering for graded optical band gap ( 〖E^opt〗_g)", Journal of Materials Science 40 (2005) 1367-1370.
Smith, Warren J., Modern Optical Engineering 3rd Edition, (2000) pp. 5-8.
Lairson, B.M., et al., "Reduced Angle-Shift Infrared Bandpass Filter Coatings," Proceedings of the SPIE, 2007, vol. 6545, pp. 65451C-1-65451C-5, 15 pages.
Lee, Cheng-Chung. "Theory and experiment of optical band pass filter shifting to short wavelength due to oblique incidence" Expert Opinion, Dec. 12, 2020, pp. 1-11.
Spectrum figure generated by a simulation according to the optical structure disclosed by Exhibit 2.
The examination opinions and the responses the applicant made during the prosecution history of the European patent application EP2872935 B1 corresponded to the '617 Patent.
Hebenstreit, Wilhelm, Ph.D., "First Analysis—Reverse Engineering Analysis of Optical Filter Analysis by Eurofins EAG", Jun. 10, 2019, 22 pages.
Hebenstreit, Wilhelm, Ph.D., "Second Analysis—Reverse Engineering Analysis of Optical Filter Analysis by Eurofins EAG", Jun. 10, 2019, 26 pages.
Record of the first hearing presided by Suzhou Intermediate People's Court, Case No. (2019) Su 05 Zhi Chu No. 392, Jun. 13, 2019, 24 pages.
List of Supplemental Exhibits provided by Patentee (ViAVI) in the first hearing presided by Suzhou Intermediate People's Court, Case No. (2019) Su 05 Zhi Chu No. 392, submitted Jun. 11, 2019, 5 pages.
Declaration of Ronald R. Willey filed in *Platinum Optics Technology Inc.*, Petitioner,v. *Viavi Solutions Inc.*, Patent Owner, Case: IPR2021-00432, U.S. Pat. No. 10,222,526, 1002 pages.
Curriculum Vitae of Ronald R. Willey dated Jan. 29, 2020, 13 pages.
File History for U.S. Appl. No. 15/158,191, filed May 18, 2016.
File History of U.S. Appl. No. 15/099,180, filed Apr. 14, 2016.
File History of U.S. Appl. No. 13/943,596, filed Jul. 16, 2013.
File History of U.S. Appl. No. 61/672,164, filed Jul. 16, 2012.
K. Gibbons, et al., Development and Implementation of a Hydrogenated a-Si Reactive Sputter Deposition Process, Society of Vacuum Coaters, 50th Ann. Tech. Conference Proceedings (2007).
P.H. Lissberger, Effective Refractive Index as a Criterion of Performance of Interference Filters, J. of the Optical Society of Am., vol. 58, No. 12, pp. 1586-1590 (Dec. 1968).
J. A. Dobrowolski, Optical Properties of Films and Coatings, in The Handbook of Optics, vol. I (Optical Soc'y of Am., 1995).
Pidegon, et al., Resolving Power of Multilayer Filters in Non-Parallel Light, J. Opt. Soc'y of Am., vol. 54, No. 12, pp. 1459-1466 (Dec. 1964).
Martin, et al., Optical Properties of Sputtered Si:H, Proc. SPIE 0324, Optical Coatings for Energy Efficiency and Solar Applications, pp. 184-190 (Apr. 12, 1982).
Complainant Viavi Solutions Inc.'s Opening Brief on Claim Construction, In re Certain Electronic Devices With Optical Filters and Optical Sensor Systems and Components Thereof, 337-TA-1187 (filed May 1, 2020).
Complainant Viavi Solutions Inc.'s Response Brief on Claim Construction, In re Certain Electronic Devices With Optical Filters and Optical Sensor Systems and Components Thereof, 337-TA-1187 (filed May 18, 2020).
Declaration of Richard A. Flasck, *Viavi Solutions Inc.* v. *Materion Corp.*, PGR2019-00017, Exhibit 1005 (executed Nov. 11, 2018).
T. Ishiguro, et al., Antireflective coating using aluminum hydroxide formed by hydrothermal treatment of sputtered aluminum films, J. Appl. Phys. 106, 023524 (Jul. 27, 2009).
Declaration of Matthew Turk, Ph.D. filed in *Platinum Optics Technology Inc.*, Petitioner, v. *Viavi Solutions Inc.*, Patent Owner, Case: IPR2021-00424, U.S. Pat. No. 9,588,269, 26 pages.
Curriculum Vitae of Matthew Turk, Ph.D., 23 pages.
Declaration of Sylvia Hall-Ellis, Ph.D. filed in *Platinum Optics Technology Inc.*, Petitioner,v. *Viavi Solutions Inc.*, Patent Owner, Case: IPR2021-00432, U.S. Pat. No. 10,222,526, 102 pages.
Microsoft XBox, "Kinect for XBox", https://web.archive.org/web/20100921061625/http://www.xbox.com: 80/en-US/hardware/k/kinectforxbox360/ (last visited Jan. 12, 2021), 1 page.
Klug, Brian, "Microsoft Kinect: The AnandTech Review", https://www.anandtech.com/show/4057/microsoft-kinect-the-anandtech-review/2 (last visited Jan. 13, 2021), 7 pages.
*Viavi Solutions Inc.* v. *Platinum Optics Technology Inc.*, No. 5:20-cv-05501-EJD, Dkt. 34 (Nov. 12, 2020), Patent Scheduling Order, 4 pages.
Lex Machina Motions Metrics Report for Stays Pending PTAB Proceedings for N.D. Cal. (Generated Jan. 18, 2021).
Lex Machina Motions Metrics Report for Stays Pending PTAB Proceedings for Judge Edward John Davila (Generated Jan. 18, 2021).
Alfred Thelen, et al., Coating design contest: antireflection coating for lenses to be used with normal and infrared photographic film, Proc. SPIE 1782, Thin Films for Optical Systems, pp. 552-601 (Mar. 4, 1993).
Plaintiff Viavi Solutions Inc.'s Supplemental Brief in Support of Entry of Protective Order, *Viavi Solutions Inc.* v. *Platinum Optics Technology Inc.*, No. 5:20-cv-05501-EJD, Dkt. 43 (Jan. 20, 2021).
Liu C., "Process Investigation of a-Si:H thin films prepared by DC magnetron sputtering", SPIE Proceedings, 2007, vol. 6825, pp. 682514-1-682514-8.
Yoda H., et al., "a-Si:H/SiO2 multilayer films fabricated by radio-frequency magnetron sputtering for optical filters", Applied Optics, Jun. 10, 2004, vol. 43 (17), pp. 3548-3554.
Ryu, Dongseok, et al. "T-less: A novel touchless human-machine interface based on infrared proximity sensing."2010 IEEE/RSJ International Conference on Intelligent Robots and Systems. IEEE, 2010, pp. 5520-5225.
Lee, Cheng-Chung. "The Angle Shift of Optical Filters and the Invention of Hudrogenated Amorphous Silicon Films by Dr. Tsai et al." Expert Opinion, Dec. 24, 2020, pp. 1-23.
Werner Luft & Y. Simon Tsuo, Hydrogenated Amorphous Silicon Alloy Deposition Processes (Marcel Dekker, Inc. 1993).
H.R. Philipp, Silicon Nitride (Si3N4) (Noncrystalline), Handbook of Optical Constants of Solids, pp. 771-774 (1985).
OTEC Presentation, http://otec.inha.ac.kr, Thin Film Optics Lab, Inha Univ, Korea, Jan. 19, 2009, 49 pages.
IPTAB Decision for the invalidation case for KR 10-1821116 filed by Optrontec (2019 Dang 1506), May 17, 2019, 61 pages.
Lee, Cheung-Chung, "Summary of hydrogenated amorphous silicon films invented by Dr. Rung-Ywan Tsai and others and his contribution on reducing the angle shift of the filters" Expert Opinion, 2021, pp. 1-23.

| Comparison of First Conventional Optical Filter and First Exemplary Optical Filter | | |
|---|---|---|
| Property | First Conventional Optical Filter | First Exemplary Optical Filter |
| FWHM (nm) | 66.0 | 46.5 |
| Center-wavelength shift, 0° to 30° (nm) | −29.1 | −12.2 |
| Background transmittance for 2856 K blackbody (%) | 14.8 | 9.75 |
| Total coating thickness (nm) | 24432 | 5688 |

FIG. 7A

| AR Coating of First Exemplary Optical Filter | | |
|---|---|---|
| Layer No. | Material | Thickness (nm) |
| 1 | $SiO_2$ | 153.5852 |
| 2 | $Ta_2O_5$ | 32.39649 |
| 3 | $SiO_2$ | 47.88567 |
| 4 | $Ta_2O_5$ | 112.6954 |
| 5 | $SiO_2$ | 146.4009 |

FIG. 7B

| Filter Stack of First Exemplary Optical Filter ||||||
|---|---|---|---|---|---|
| Layer No. | Material | Thickness (nm) | Layer No. | Material | Thickness (nm) |
| 1 | Si:H | 12.06225 | 25 | Si:H | 123.9279 |
| 2 | SiO$_2$ | 207.0239 | 26 | SiO$_2$ | 73.3697 |
| 3 | Si:H | 112.2893 | 27 | Si:H | 92.284 |
| 4 | SiO$_2$ | 131.3289 | 28 | SiO$_2$ | 93.71968 |
| 5 | Si:H | 58.57214 | 29 | Si:H | 57.99244 |
| 6 | SiO$_2$ | 123.472 | 30 | SiO$_2$ | 129.6102 |
| 7 | Si:H | 121.8488 | 31 | Si:H | 118.8611 |
| 8 | SiO$_2$ | 62.37868 | 32 | SiO$_2$ | 121.0311 |
| 9 | Si:H | 94.08999 | 33 | Si:H | 58.78395 |
| 10 | SiO$_2$ | 91.40882 | 34 | SiO$_2$ | 126.8949 |
| 11 | Si:H | 68.58871 | 35 | Si:H | 27.06202 |
| 12 | SiO$_2$ | 97.34483 | 36 | SiO$_2$ | 265.4308 |
| 13 | Si:H | 126.2579 | 37 | Si:H | 107.9248 |
| 14 | SiO$_2$ | 65.22393 | 38 | SiO$_2$ | 103.3531 |
| 15 | Si:H | 87.89165 | 39 | Si:H | 33.0597 |
| 16 | SiO$_2$ | 95.32283 | 40 | SiO$_2$ | 225.0774 |
| 17 | Si:H | 68.92315 | 41 | Si:H | 32.91478 |
| 18 | SiO$_2$ | 96.5938 | 42 | SiO$_2$ | 284.8275 |
| 19 | Si:H | 126.1687 | 43 | Si:H | 90.36095 |
| 20 | SiO$_2$ | 66.16271 | 44 | SiO$_2$ | 79.30571 |
| 21 | Si:H | 88.58283 | 45 | Si:H | 55.39493 |
| 22 | SiO$_2$ | 96.5938 | 46 | SiO$_2$ | 247.4205 |
| 23 | Si:H | 63.19303 | 47 | Si:H | 95.3999 |
| 24 | SiO$_2$ | 103.7141 | 48 | SiO$_2$ | 285.9541 |

FIG. 7C

| Comparison of Second Conventional Optical Filter and Second Exemplary Optical Filter | | |
|---|---|---|
| Property | Second Conventional Optical Filter | Second Exemplary Optical Filter |
| FWHM (nm) | 29.1 | 29.6 |
| Center-wavelength shift, 0° to 20° (nm) | −12.7 | −7.8 |
| Background transmittance for 2856 K blackbody (%) | 5.84 | 5.54 |
| Total coating thickness (nm) | 13780 | 3312 |

FIG. 8A

| Filter Stack of Second Exemplary Optical Filter | | | | | |
|---|---|---|---|---|---|
| Layer No. | Material | Thickness (nm) | Layer No. | Material | Thickness (nm) |
| 1 | SiO$_2$ | 169.8593 | 14 | Si:H | 42.95783 |
| 2 | Si:H | 25.36196 | 15 | SiO$_2$ | 151.3625 |
| 3 | SiO$_2$ | 169.8593 | 16 | Si:H | 108.6165 |
| 4 | Si:H | 108.6165 | 17 | SiO$_2$ | 141.1964 |
| 5 | SiO$_2$ | 141.1964 | 18 | Si:H | 54.30826 |
| 6 | Si:H | 54.30826 | 19 | SiO$_2$ | 173.3892 |
| 7 | SiO$_2$ | 173.3892 | 20 | Si:H | 22.70085 |
| 8 | Si:H | 22.70085 | 21 | SiO$_2$ | 173.3892 |
| 9 | SiO$_2$ | 173.3892 | 22 | Si:H | 108.6165 |
| 10 | Si:H | 108.6165 | 23 | SiO$_2$ | 155.1748 |
| 11 | SiO$_2$ | 141.1964 | 24 | Si:H | 38.8304 |
| 12 | Si:H | 54.30826 | 25 | SiO$_2$ | 155.1748 |
| 13 | SiO$_2$ | 151.3625 | | | |

FIG. 8B

| Filter Stack of Third Exemplary Optical Filter ||||||
|---|---|---|---|---|---|
| Layer No. | Material | Thickness (nm) | Layer No. | Material | Thickness (nm) |
| 1 | Si:H | 48.99656 | 16 | $SiO_2$ | 144.9036 |
| 2 | $SiO_2$ | 27.72806 | 17 | Si:H | 172.5048 |
| 3 | Si:H | 261.865 | 18 | $SiO_2$ | 144.8237 |
| 4 | $SiO_2$ | 175.7108 | 19 | Si:H | 229.229 |
| 5 | Si:H | 67.55759 | 20 | $SiO_2$ | 131.8658 |
| 6 | $SiO_2$ | 48.09467 | 21 | Si:H | 77.24942 |
| 7 | Si:H | 245.3538 | 22 | $SiO_2$ | 139.1643 |
| 8 | $SiO_2$ | 157.5898 | 23 | Si:H | 225.9625 |
| 9 | Si:H | 53.78669 | 24 | $SiO_2$ | 115.736 |
| 10 | $SiO_2$ | 117.5423 | 25 | Si:H | 97.86642 |
| 11 | Si:H | 234.1488 | 26 | $SiO_2$ | 170.7001 |
| 12 | $SiO_2$ | 146.2907 | 27 | Si:H | 232.4637 |
| 13 | Si:H | 172.8534 | 28 | $SiO_2$ | 168.9233 |
| 14 | $SiO_2$ | 143.1595 | 29 | Si:H | 118.3322 |
| 15 | Si:H | 230.0482 | | | |

FIG. 9A

OPTICAL FILTER AND SENSOR SYSTEM

CROSS-REFERENCE TO RELATED APPLICATIONS

This application is a continuation of U.S. patent application Ser. No. 15/617,654, filed Jun. 8, 2017 (now U.S. Pat. No. 10,222,526), which is a continuation of U.S. patent application Ser. No. 15/099,180, filed Apr. 14, 2016 (now U.S. Pat. No. 9,945,995), which is a continuation of U.S. patent application Ser. No. 13/943,596, filed Jul. 16, 2013 (now U.S. Pat. No. 9,354,369), which claims priority from U.S. Provisional Patent Application No. 61/672,164, filed on Jul. 16, 2012, the contents of which are incorporated herein by reference.

TECHNICAL FIELD OF THE INVENTION

The present invention relates to optical filters and to sensor systems comprising optical filters. More particularly, the present invention relates to optical filters including hydrogenated silicon layers and to sensor systems comprising such optical filters.

BACKGROUND OF THE INVENTION

In a typical gesture-recognition system, a light source emits near-infrared light towards a user. A three-dimensional (3D) image sensor detects the emitted light that is reflected by the user to provide a 3D image of the user. A processing system then analyzes the 3D image to recognize a gesture made by the user.

An optical filter, more specifically, a bandpass filter, is used to transmit the emitted light to the 3D image sensor, while substantially blocking ambient light. In other words, the optical filter serves to screen out ambient light. Therefore, an optical filter having a narrow passband in the near-infrared wavelength range, i.e., 800 nm to 1100 nm, is required. Furthermore, the optical filter must have a high transmittance level within the passband and a high blocking level outside of the passband.

Conventionally, the optical filter includes a filter stack and a blocking stack, coated on opposite surfaces of a substrate. Each of the stacks is formed of high-refractive-index layers and low-refractive-index layers stacked in alternation. Different oxides are, generally, used for the high-refractive-index layers and the low-refractive-index layers, such as $TiO_2$, $Nb_2O_5$, $Ta_2O_5$, $SiO_2$, and mixtures thereof. For example, some conventional optical filters include a $TiO_2$/$SiO_2$ filter stack and a $Ta_2O_5$/$SiO_2$ blocking stack, in which the high-refractive index layers are composed of $TiO_2$ or $Ta_2O_5$, respectively, and the low-refractive-index layers are composed of $SiO_2$.

In a first conventional optical filter designed to transmit light in a wavelength range of 829 nm to 859 nm over an incidence angle range of 0° to 30°, the filter stack includes 71 layers, the blocking stack includes 140 layers, and the total coating thickness is about 24 μm. Transmission spectra 100 and 101 at incidence angles of 0° and 30°, respectively, for this optical filter are plotted in FIG. 1. In a second conventional optical filter designed to transmit light at a wavelength of 825 nm over an incidence angle range of 0° to 20°, the filter stack includes 43 layers, the blocking stack includes 82 layers, and the total coating thickness is about 14 μm. Transmission spectra 200 and 201 at incidence angles of 0° and 20°, respectively, for this optical filter are plotted in FIG. 2. In a third conventional optical filter designed to transmit light in a wavelength range of 845 nm to 865 nm over an incidence angle range of 0° to 24°, the filter stack includes 77 layers, the blocking stack includes 148 layers, and the total coating thickness is about 26 μm. Transmission spectra 300 and 301 at incidence angles of 0° and 24°, respectively, for this optical filter are plotted in FIG. 3.

With reference to FIGS. 1-3, the first, second, and third conventional optical filters, generally, have a high transmittance level within the passband and a high blocking level outside of the passband. However, the center wavelength of the passband undergoes a relatively large shift with change in incidence angle. Consequently, the passband must be relatively wide to accept light over the required incidence angle range, increasing the amount of ambient light that is transmitted and reducing the signal-to-noise ratio of systems incorporating these conventional optical filters. Furthermore, the large number of layers in the filter stacks and blocking stacks increases the expense and coating time involved in fabricating these conventional optical filters. The large total coating thickness also makes these conventional optical filters difficult to pattern, e.g., by photolithography.

To enhance the performance of the optical filter in the gesture-recognition system, it would be desirable to reduce the number of layers, the total coating thickness, and the center-wavelength shift with change in incidence angle. One approach is to use a material having a higher refractive index than conventional oxides over the wavelength range of 800 nm to 1100 nm for the high-refractive-index layers. In addition to a higher refractive index, the material must have also have a low extinction coefficient over the wavelength range of 800 nm to 1100 nm in order to provide a high transmittance level within the passband.

The use of hydrogenated silicon (Si:H) for high-refractive-index layers in optical filters is disclosed by Lairson, et al. in an article entitled "Reduced Angle-Shift Infrared Bandpass Filter Coatings" (Proceedings of the SPIE, 2007, Vol. 6545, pp. 65451C-1-65451C-5), and by Gibbons, et al. in an article entitled "Development and Implementation of a Hydrogenated a-Si Reactive Sputter Deposition Process" (Proceedings of the Annual Technical Conference, Society of Vacuum Coaters, 2007, Vol. 50, pp. 327-330). Lairson, et al. disclose a hydrogenated silicon material having a refractive index of 3.2 at a wavelength of 1500 nm and an extinction coefficient of less than 0.001 at wavelengths of greater than 1000 nm. Gibbons, et al. disclose a hydrogenated silicon material, produced by alternating current (AC) sputtering, having a refractive index of 3.2 at a wavelength of 830 nm and an extinction coefficient of 0.0005 at a wavelength of 830 nm. Unfortunately, these hydrogenated silicon materials do not have a suitably low extinction coefficient over the wavelength range of 800 nm to 1100 nm.

SUMMARY OF THE INVENTION

Accordingly, the present invention relates to an optical filter having a passband at least partially overlapping with a wavelength range of 800 nm to 1100 nm, comprising: a filter stack including: a plurality of hydrogenated silicon layers each having a refractive index of greater than 3 over the wavelength range of 800 nm to 1100 nm and an extinction coefficient of less than 0.0005 over the wavelength range of 800 nm to 1100 nm; and a plurality of lower-refractive-index layers each having a refractive index of less than 3 over the wavelength range of 800 nm to 1100 nm, stacked in alternation with the plurality of hydrogenated silicon layers.

The present invention also relates to a sensor system comprising: a light source for emitting light at an emission wavelength in a wavelength range of 800 nm to 1100 nm; an optical filter having a passband including the emission wavelength and at least partially overlapping with the wavelength range of 800 nm to 1100 nm, disposed to receive the emitted light, for transmitting the emitted light while substantially blocking ambient light, comprising: a filter stack including: a plurality of hydrogenated silicon layers each having a refractive index of greater than 3 over the wavelength range of 800 nm to 1100 nm and an extinction coefficient of less than 0.0005 over the wavelength range of 800 nm to 1100 nm; and a plurality of lower-refractive-index layers each having a refractive index of less than 3 over the wavelength range of 800 nm to 1100 nm, stacked in alternation with the plurality of hydrogenated silicon layers; and a sensor, disposed to receive the emitted light after transmission by the optical filter, for detecting the emitted light.

BRIEF DESCRIPTION OF THE DRAWINGS

The present invention will be described in greater detail with reference to the accompanying drawings wherein:

FIG. 7A is a table comparing properties of the first conventional optical filter of FIG. 1 and a first exemplary optical filter according to the present invention;

FIG. 7B is a table listing layer numbers, materials, and thicknesses for the antireflective (AR) coating of the first exemplary optical filter;

FIG. 7C is a table listing layer numbers, materials, and thicknesses for the filter stack of the first exemplary optical filter;

FIG. 8A is a table comparing properties of the second conventional optical filter of FIG. 2 and a second exemplary optical filter according to the present invention;

FIG. 8B is a table listing layer numbers, materials, and thicknesses for the filter stack of the second exemplary optical filter;

FIG. 9A is a table listing layer numbers, materials, and thicknesses for the filter stack of a third exemplary optical filter according to the present invention;

DETAILED DESCRIPTION OF THE INVENTION

The present invention provides an optical filter including hydrogenated silicon (Si:H) layers, which is particularly suitable for use in a sensor system, such as a proximity sensor system, a three-dimensional (3D) imaging system, or a gesture-recognition system.

The optical filter of the present invention uses an improved hydrogenated silicon material, which has both a high refractive index and a low absorption coefficient over a wavelength range of 800 nm to 1100 nm, i.e., in the near-infrared wavelength range. Typically, the hydrogenated silicon material is amorphous. The hydrogenated silicon material is, preferably, produced by pulsed direct current (DC) sputtering. A sputter-deposition system suitable for producing the hydrogenated silicon material is described in U.S. Pat. No. 8,163,144 to Tilsch, et al., issued on Apr. 24, 2012, which is incorporated herein by reference.

Figure 4:
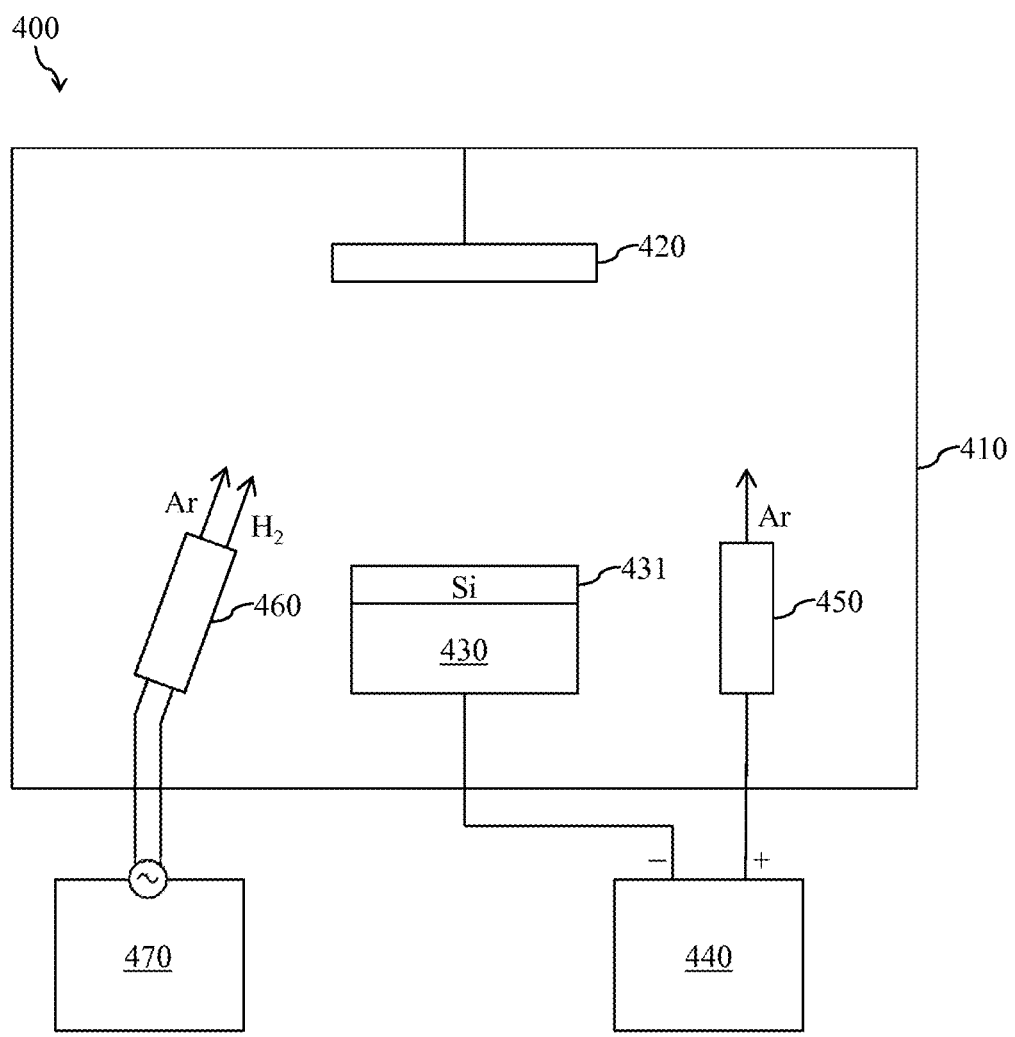
FIG. 4 is a schematic illustration of a sputter-deposition system.

With reference to FIG. 4, a typical sputter-deposition system 400 used to produce the hydrogenated silicon material includes a vacuum chamber 410, a substrate 420, a cathode 430, a cathode power supply 440, an anode 450, a plasma activation source (PAS) 460, and a PAS power supply 470. The cathode 430 is powered by the cathode power supply 440, which is a pulsed DC power supply. The PAS 460 is powered by the PAS power supply 470, which is a radio frequency (RF) power supply.

The cathode 430 includes a silicon target 431, which is sputtered in the presence of hydrogen (H$_2$), as well as an inert gas such as argon, to deposit the hydrogenated silicon material as a layer on the substrate 420. The inert gas is introduced into the vacuum chamber 410 through the anode 450 and the PAS 460. Alternatively, the walls of the vacuum chamber 410 may serve as the anode, and the inert gas may be introduced at a different location.

Hydrogen is introduced into the vacuum chamber 410 through the PAS 460, which serves to activate the hydrogen. Activated hydrogen is more chemically reactive and is, therefore, more likely to create Si—H bonds, which are thought to be responsible for the optical properties of the hydrogenated silicon material. The PAS 460 is located very close to the cathode 430, allowing the PAS plasma and the cathode plasma to overlap. Both atomic and molecular species of activated hydrogen are believed to be present in the plasmas. The use of the PAS 460 allows the hydrogenated silicon layer to be deposited at a relatively high deposition rate with a relatively low hydrogen content. Typically, the hydrogenated silicon layer is deposited at a deposition rate of 0.05 nm/s to 1.2 nm/s, preferably, at a deposition rate of about 0.8 nm/s. Alternatively, the cathode plasma alone may be used for hydrogen activation.

The optical properties of the hydrogenated silicon material depend primarily on the hydrogen content in the vacuum chamber 410 and, therefore, on the hydrogen flow rate. However, they are also influenced by other parameters, such as the flow rate of the inert gas, the PAS power level, the cathode power level, and the deposition rate.

Figure 5A:
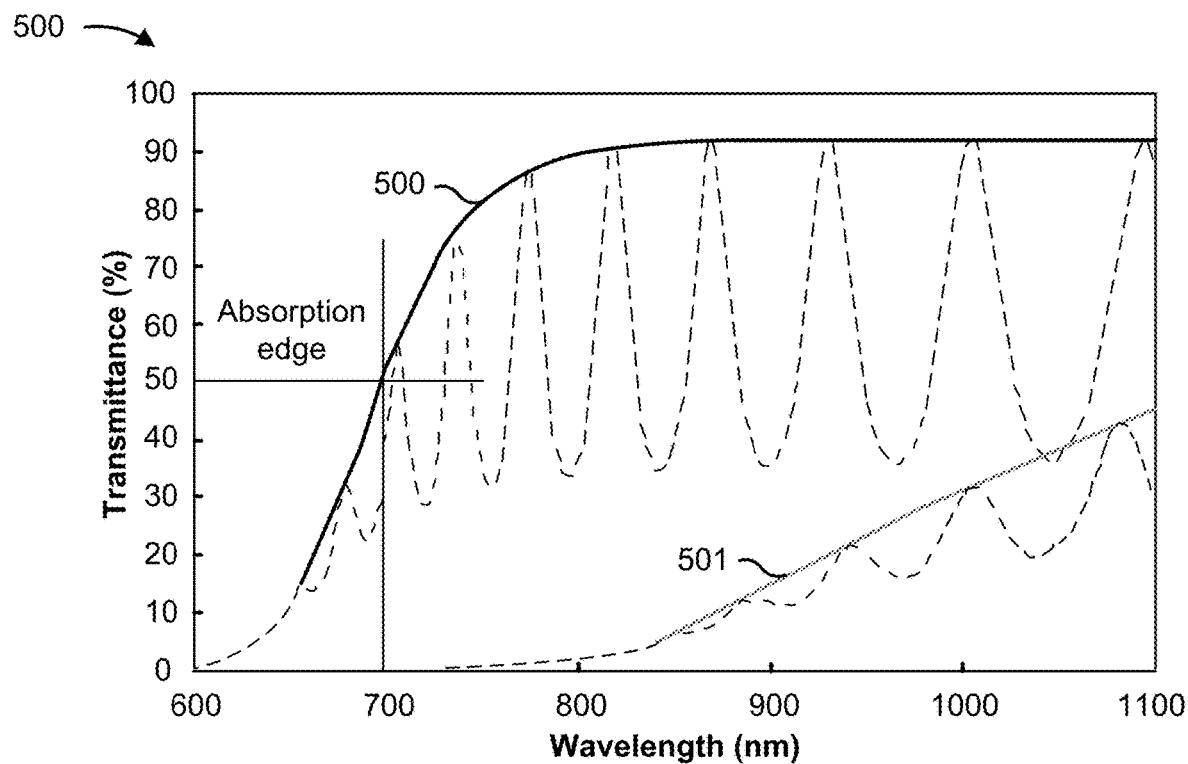
FIG. 5A is a plot of transmittance spectra for 1500-nm-thick silicon layers deposited in the presence and absence of hydrogen.

FIG. 5A shows transmission spectra 500 and 501 for 1500-nm-thick silicon layers deposited in the presence of hydrogen, at a hydrogen flow rate of 139 sccm, and in the absence of hydrogen, respectively. The silicon layer deposited in the presence of hydrogen, i.e., the hydrogenated silicon layer, has a significantly higher transmittance level over the wavelength range of 800 nm to 1100 nm.

Figure 5B:
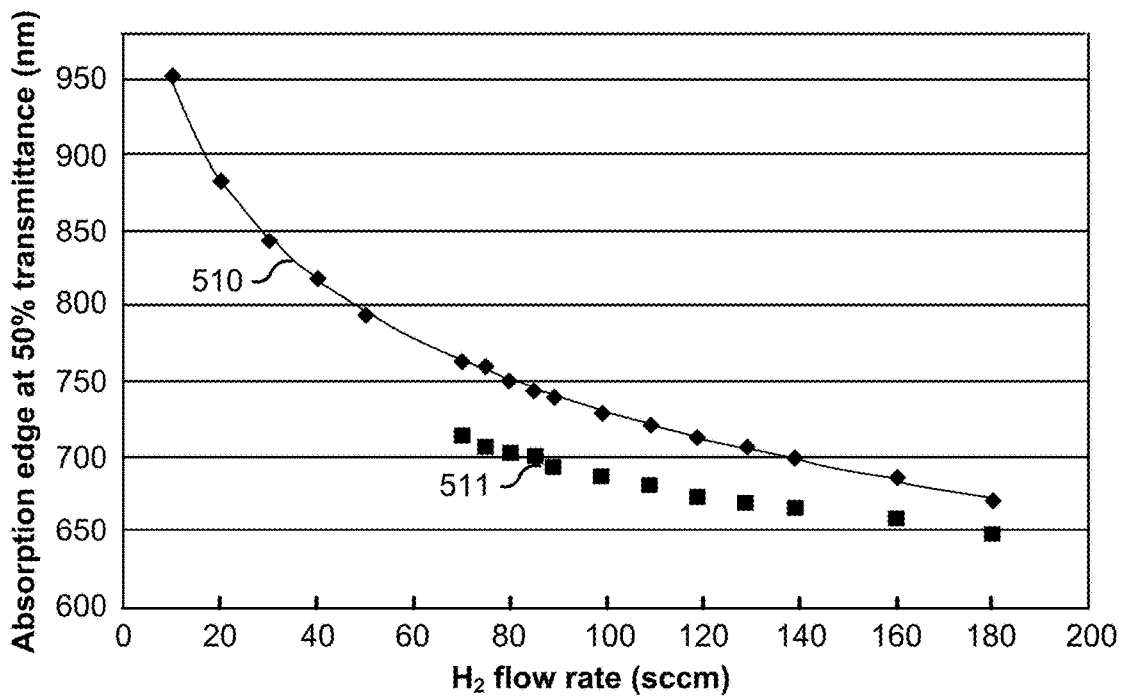
FIG. 5B is a plot of the absorption-edge wavelength at a transmittance level of 50% against hydrogen flow rate for hydrogenated silicon (Si:H) layers before and after an annealing step.

FIG. 5B shows curves 510 and 511 of the absorption-edge wavelength at a transmittance level of 50% against hydrogen flow rate for hydrogenated silicon layers before and after an annealing step, respectively. For the as-deposited hydrogenated silicon layers, the absorption-edge wavelength decreases with increasing hydrogen flow rate. Generally, the absorption-edge wavelength varies approximately logarithmically with hydrogen flow rate. The absorption-edge wavelength is decreased further by the annealing step, which was carried out at a temperature of about 300° C. for about 60 minutes. Typically, when an optional post-coating annealing step is performed, the hydrogenated silicon layers are annealed at a temperature of up to 350° C. for up to 120 minutes, preferably, at a temperature of 250° C. to 350° C. for 30 to 90 minutes. In some instances, more than one annealing step may be performed.

Thus, the absorption-edge wavelength of the hydrogenated silicon material can be tuned by adjusting the hydrogen flow rate and, optionally, by annealing. Likewise, the refractive index and the absorption coefficient of the hydrogenated silicon material can also can be tuned by adjusting the hydrogen flow rate and, optionally, by annealing. Typically, the hydrogenated silicon layers are deposited with a hydrogen flow rate of greater than 80 sccm, preferably, a hydrogen flow rate of about 80 sccm. However, it should be noted that the hydrogen content associated with this flow rate will depend on the pumping speed of the vacuum system.

Figure 5C:
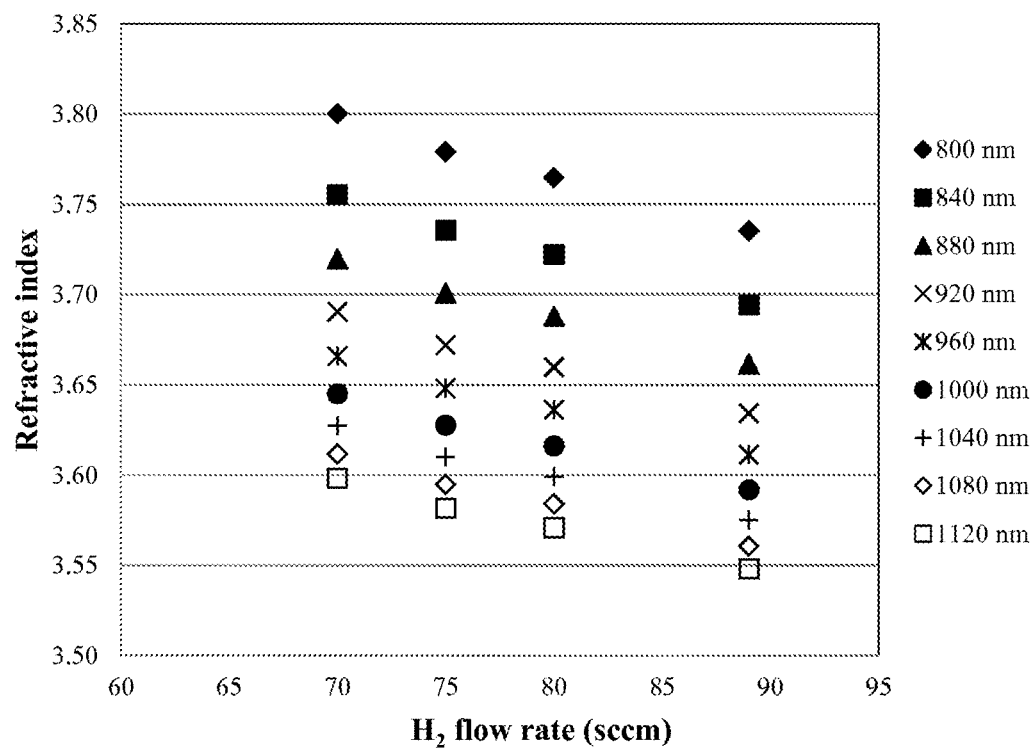
FIG. 5C is a plot of refractive index at wavelengths of 800 nm to 1120 nm against hydrogen flow rate for hydrogenated silicon layers.

FIG. 5C shows a plot of refractive index at wavelengths of 800 nm to 1120 nm against hydrogen flow rate for as-deposited hydrogenated silicon layers. The refractive index decreases with increasing hydrogen flow rate. Generally, the refractive index varies approximately linearly with hydrogen flow rate. In particular, the refractive index of the hydrogenated silicon layer produced at a hydrogen flow rate of 80 sccm is greater than 3.55 over the wavelength range of 800 nm to 1120 nm.

Figure 5D:
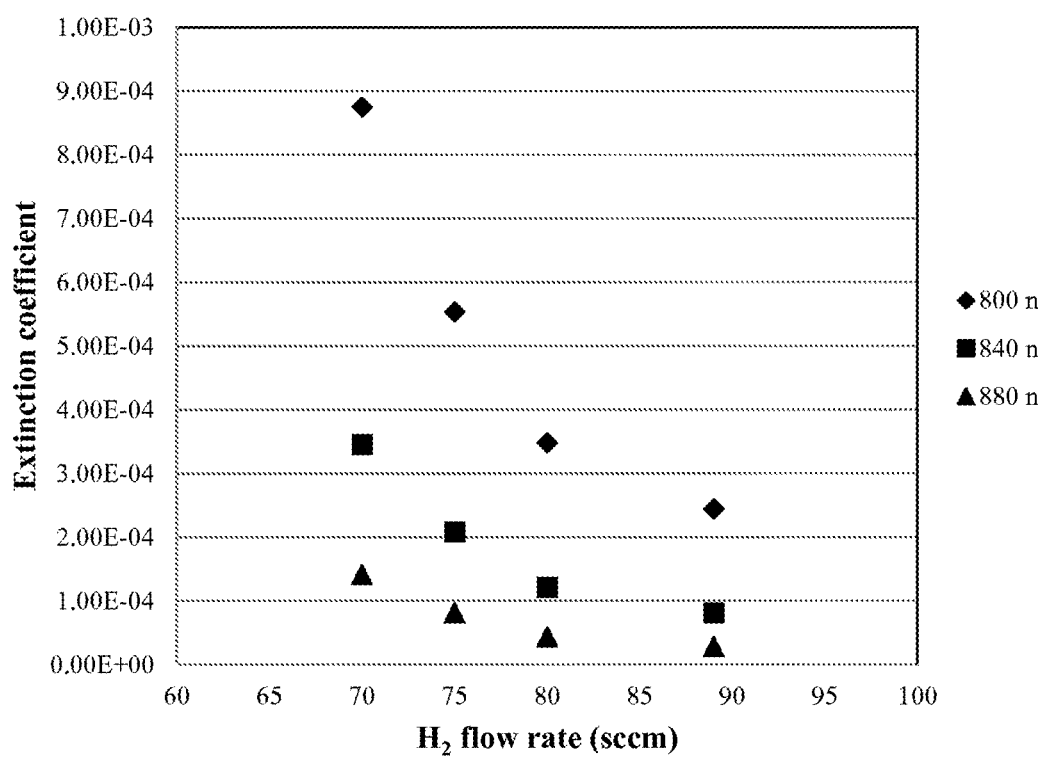
FIG. 5D is a plot of absorption coefficient at wavelengths of 800 nm to 880 nm against hydrogen flow rate for hydrogenated silicon layers.

FIG. 5D shows a plot of absorption coefficient at wavelengths of 800 nm to 880 nm against hydrogen flow rate for as-deposited hydrogenated silicon layers (the absorption coefficient is less than 0.0001 at wavelengths of 920 nm to 1120 nm). The absorption coefficient decreases with increasing hydrogen flow rate. Generally, the absorption coefficient varies approximately exponentially with hydrogen flow rate. In particular, the absorption coefficient of the hydrogenated silicon layer produced at a hydrogen flow rate of 80 sccm is less than 0.0004 over the wavelength range of 800 nm to 1120 nm.

Figure 6:
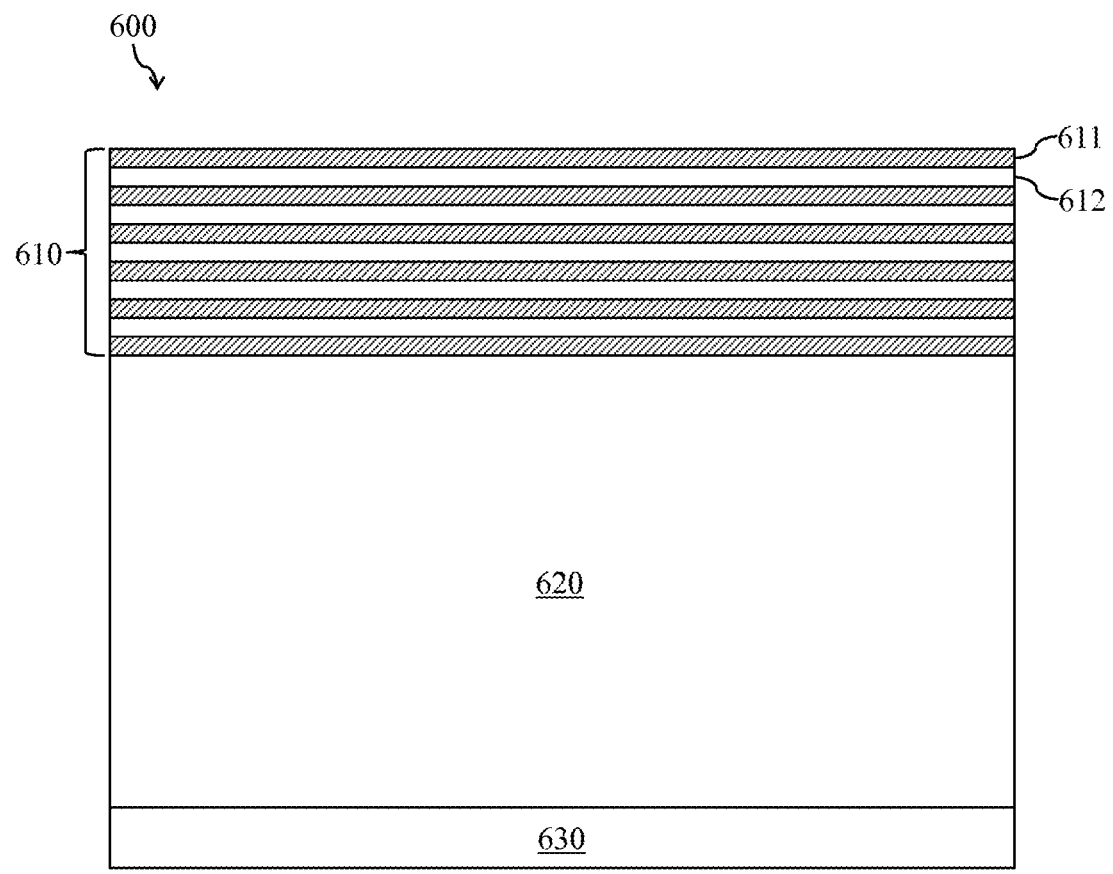
FIG. 6 is a schematic illustration of a cross-section of an optical filter according to the present invention.

The improved hydrogenated silicon material, tuned to have suitable optical properties, is used in the optical filter of the present invention. With reference to FIG. 6, the optical filter 600 includes a filter stack 610, which is disposed on a first surface of a substrate 620. In most instances, the substrate 620 is a free-standing substrate, typically, a glass substrate, e.g., a borofloat glass substrate. Alternatively, the substrate 620 may be a sensor or another device. When the substrate 620 is a free-standing substrate, an antireflective (AR) coating 630 is often disposed on a second surface of the substrate 620 opposite the first surface. Typically, the AR coating 630 is a multilayer interference coating, e.g., a $Ta_2O_5/SiO_2$ coating. Also typically, the AR coating 630 has a thickness of 0.1 μm to 1 μm.

The filter stack 610 includes a plurality of hydrogenated silicon layers 611, which serve as higher-refractive-index layers, and a plurality of lower-refractive-index layers 612 stacked in alternation. Usually, the filter stack 610 consists of a plurality of hydrogenated silicon layers 611 and a plurality of lower-refractive-index layers 612 stacked in a sequence of $(H/L)_n$, $(H/L)_nH$, or $L(H/L)_n$. Typically, the filter stack 610 includes a total of 10 to 100 layers, i.e., $5 \leq n \leq 50$. Also typically, the hydrogenated silicon layers 611 and the lower-refractive-index layers 612 each have a thickness of 3 nm to 300 nm, and the filter stack 610 has a thickness of 1 μm to 10 μm. Generally, the layer numbers and thicknesses are selected according to a particular optical design. Preferably, the optical filter 600 has a total coating thickness, i.e., the thickness of the filter stack 610 and the AR coating 630, of less than 10 μm.

The hydrogenated silicon layers 611 are composed of the improved hydrogenated silicon material tuned to have a refractive index of greater than 3 and an extinction coefficient of less than 0.0005 over the wavelength range of 800 nm to 1100 nm. Preferably, the hydrogenated silicon material has a refractive index of greater than 3.5 over the wavelength range of 800 nm to 1100 nm, e.g., a refractive index of greater than 3.64, i.e., about 3.6, at a wavelength of 830 nm. A higher refractive index is usually desirable. However, generally, the hydrogenated silicon material has a refractive index of less than 4.5 over the wavelength range of 800 nm to 1100 nm.

Preferably, the hydrogenated silicon material has an extinction coefficient of less than 0.0004 over the wavelength range of 800 nm to 1100 nm, more preferably, an extinction coefficient of less than 0.0003 over the wavelength range of 800 nm to 1100 nm. Typically, the hydrogenated silicon material has an extinction coefficient of greater than 0.01 at wavelengths of less than 600 nm, preferably, an extinction coefficient of greater than 0.05 at wavelengths of less than 650 nm. Because the hydrogenated silicon material is relatively strongly absorbing at wavelengths of less than 600 nm, an additional blocking stack is not necessary in the optical filter 600.

The lower-refractive-index layers 612 are composed of a lower-refractive-index material having a refractive index lower than that of the hydrogenated silicon layers 611 over the wavelength range of 800 nm to 1100 nm. Typically, the lower-refractive-index material has a refractive index of less than 3 over the wavelength range of 800 nm to 1100 nm. Preferably, the lower-refractive-index material has a refractive index of less than 2.5 over the wavelength range of 800 nm to 1100 nm, more preferably, a refractive index of less than 2 over the wavelength range of 800 nm to 1100 nm.

A lower refractive index is usually desirable for the lower-refractive-index layers 612 to increase the width of the blocking wavelength range, i.e., the stopband, of the optical filter 600, allowing the same blocking level to be achieved with fewer layers in the filter stack 610. However, in some instances, a somewhat higher refractive index that is still lower than that of hydrogenated silicon layers 611 may be desirable to reduce the center-wavelength shift with change in incidence angle, i.e., angle shift, of the optical filter 600.

In most instances, the lower-refractive-index material is a dielectric material, typically, an oxide. Suitable lower-refractive-index materials include silicon dioxide ($SiO_2$), aluminum oxide ($Al_2O_3$), titanium dioxide ($TiO_2$), niobium pentoxide ($Nb_2O_5$), tantalum pentoxide ($Ta_2O_5$), and mixtures thereof, i.e., mixed oxides.

The optical filter 600 may be fabricated by using a sputtering process. Typically, the substrate 620 is provided in the vacuum chamber of a sputter-deposition system similar to that illustrated in FIG. 4. The hydrogenated silicon layers 611 and the lower-refractive-index layers 612 are then sequentially deposited on the first surface of the substrate 620 to form the filter stack 610 as a multilayer coating. Typically, the hydrogenated silicon layers 611 are deposited by pulsed-DC sputtering of a silicon target in the presence of hydrogen, as described heretofore. Also typically, the lower-refractive-index layers 612 are deposited by pulsed-DC sputtering of one or more suitable metal targets, e.g., a silicon target, an aluminum target, a titanium target, a niobium target, and/or a tantalum target, in the presence of oxygen. The AR coating 630 is deposited on the second surface of the substrate 620 in a similar fashion. It should be noted that the order of forming the filter stack 610 and the AR coating 630 is usually unimportant.

The optical filter 600 is an interference filter having a passband at least partially overlapping with the wavelength range of 800 nm to 1100 nm. The passband may include the entire wavelength range of 800 nm to 1100 nm or, more typically, only a part of the wavelength range. The passband may be restricted to part or all of the wavelength range of 800 nm to 1100 nm, or may extend beyond the wavelength range. Preferably, the optical filter 600 has a transmittance level, within the passband, of greater than 90% over the wavelength range of 800 nm to 1100 nm.

The optical filter 600 provides blocking outside of the passband, i.e., a stopband on one or both sides of the passband, typically, over a wavelength range of 400 nm to 1100 nm, preferably, over a wavelength range of 300 nm to 1100 nm. Preferably, the optical filter 600 has a blocking level, outside of the passband, of greater than OD2 over the wavelength range of 400 nm to 1100 nm, more preferably, a blocking level of greater than OD3 over the wavelength range of 300 nm to 1100 nm.

In some instances, the optical filter 600 is a long-wavelength-pass edge filter, and the passband has an edge wavelength in the wavelength range of 800 nm to 1100 nm. However, in most instances, the optical filter 600 is a bandpass filter, preferably, a narrow bandpass filter. Typically, the passband has a center wavelength in the wavelength range of 800 nm to 1100 nm. Preferably, the passband has a full width at half maximum (FWHM) of less than 50 nm. Often, the entire passband is within the wavelength range of 800 nm to 1100 nm.

Generally, the optical filter 600 has a low center-wavelength shift with change in incidence angle. Preferably, the center wavelength of the passband shifts by less than 20 nm in magnitude with a change in incidence angle from 0° to 30°. Accordingly, the optical filter 600 has a wide incidence-angle acceptance range.

The optical filter 600 may have a variety of optical designs. In general, the optical design of the optical filter 600 is optimized for a particular passband by selecting suitable layer numbers, materials, and/or thicknesses for the filter stack 610. Some exemplary optical filters, described hereafter, include an Si:H/$SiO_2$ filter stack and a $Ta_2O_5$/$SiO_2$ AR coating, coated on opposite surfaces of a borofloat glass substrate.

With reference to FIG. 7, a first exemplary optical filter is a narrow bandpass filter that is designed to transmit light in a wavelength range of 829 nm to 859 nm over an incidence angle range of 0° to 30°. The first exemplary optical filter of FIG. 7 is comparable to the first conventional optical filter of FIG. 1, and some properties of the optical filters are compared in FIG. 7A. Design data, i.e., layer numbers (from substrate to air), materials, and thicknesses, for the AR coating and the filter stack of the first exemplary filter are listed in FIGS. 7B and 7C, respectively. The filter stack includes 48 layers, the AR coating includes 5 layers, and the total coating thickness is about 5.7 μm.

Figure 7D:
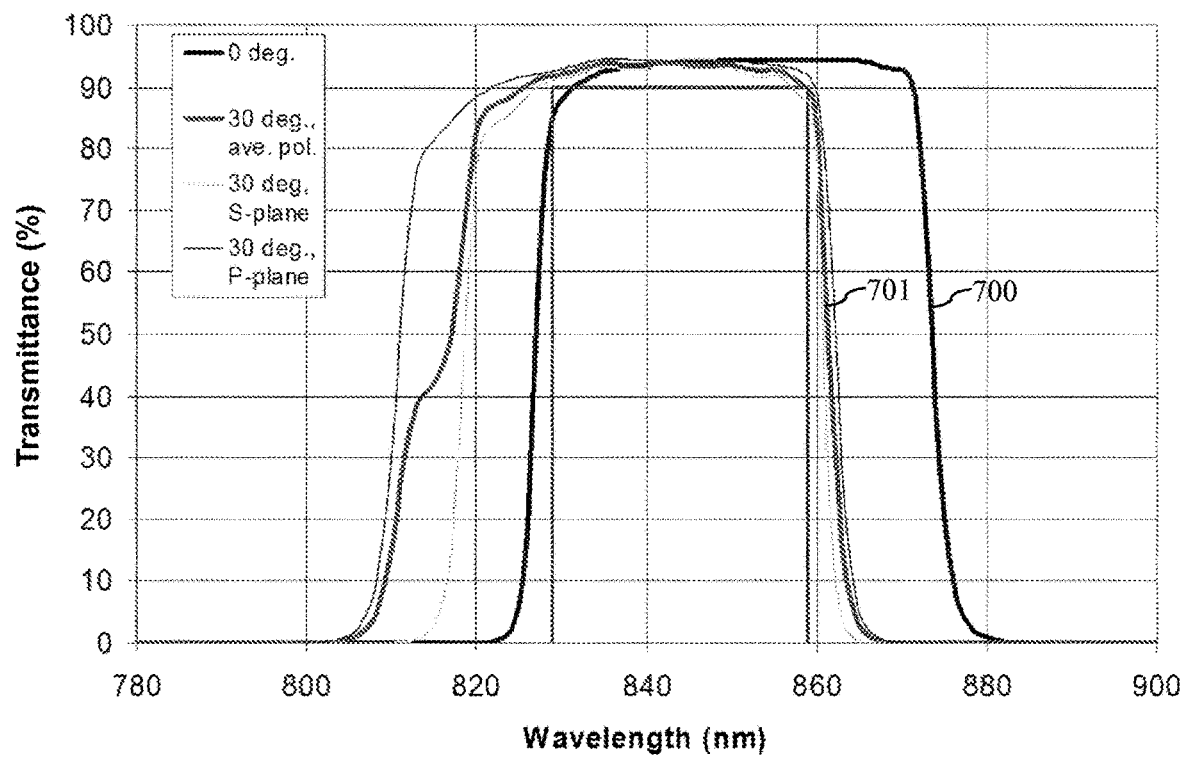
FIG. 7D is a plot of transmittance spectra at incidence angles of 0° and 30° for the first exemplary optical filter.
Figure 7E:
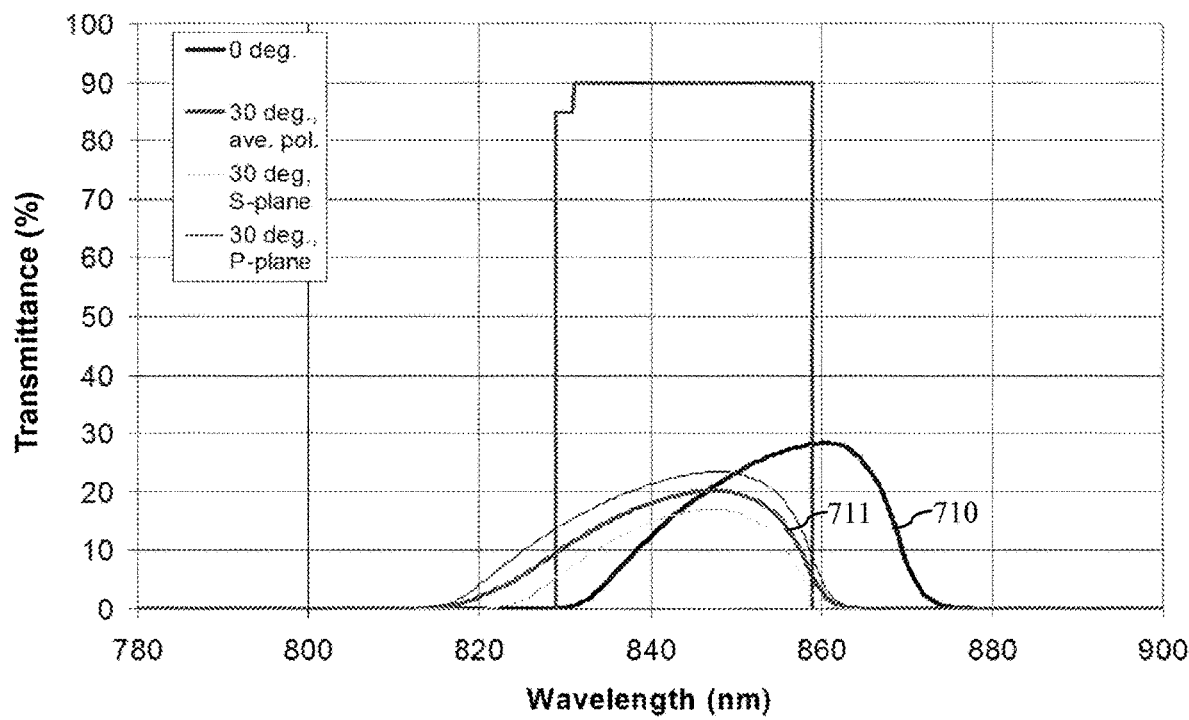
FIG. 7E is a plot of transmittance spectra at incidence angles of 0° and 30° for an optical filter analogous to the first exemplary optical filter, but including an Si/SiO$_2$ filter stack.

Transmission spectra 700 and 701 at incidence angles of 0° and 30°, respectively, for the first exemplary optical filter are plotted in FIG. 7D. The first exemplary optical filter has a transmittance level, within the passband, of greater than 90%, and a blocking level, outside of the passband, of greater than OD3 over a wavelength range of 450 nm to 1050 nm. The passband has a center wavelength of about 850 nm and a FWHM of about 46.5 nm at an incidence angle of 0°. With change in incidence angle from 0° to 30°, the center wavelength of the passband shifts by about −12.2 nm.

Figure 1:
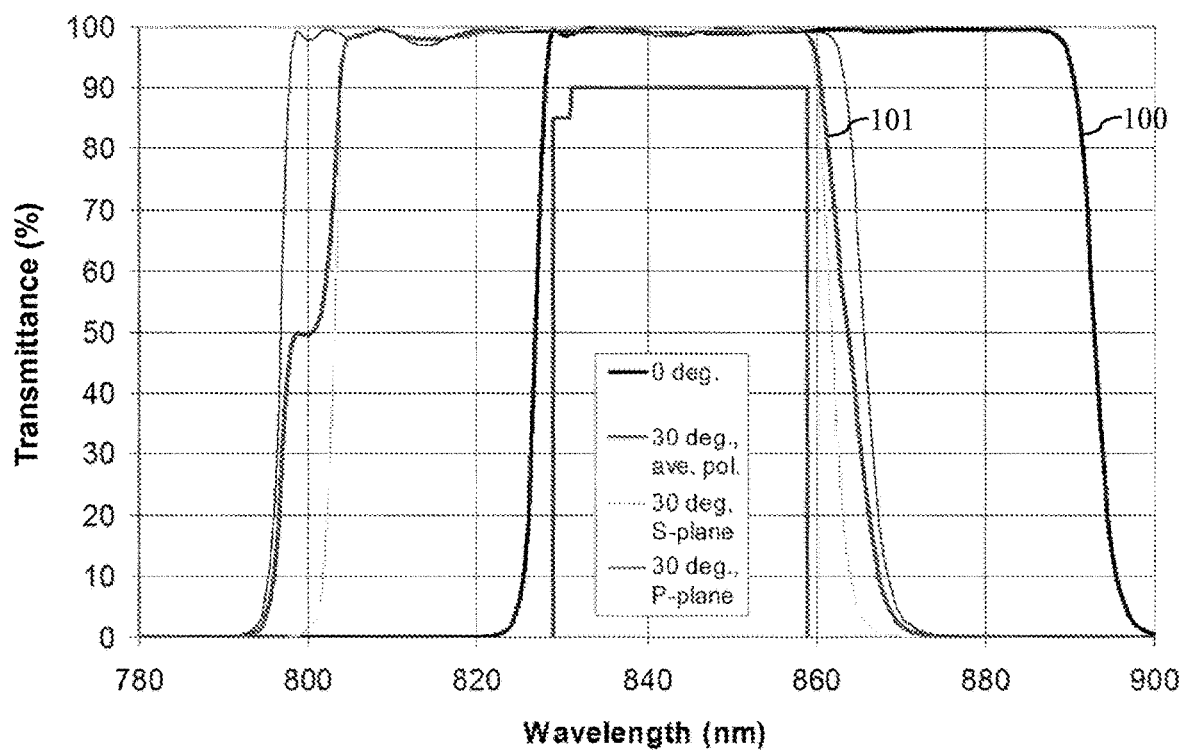
FIG. 1 is a plot of transmittance spectra at incidence angles of 0° and 30° for a first conventional optical filter.

Advantageously, the first exemplary optical filter of FIG. 7 includes fewer layers and has a smaller total coating thickness than the first conventional optical filter of FIG. 1. In particular, the total coating thickness of the first exemplary optical filter is about one quarter of the total coating thickness of the first conventional optical filter. Therefore, the first exemplary optical filter is less expensive to fabricate and is easier to pattern. Also advantageously, the first exemplary optical filter has a lower center-wavelength shift with change in incidence angle. Therefore, the passband of the first exemplary optical filter can be significantly narrower while accepting light over the same incidence angle range, improving the signal-to-noise ratio of systems incorporating the first exemplary optical filter.

The first exemplary optical filter may also be compared to an analogous optical filter including an Si/$SiO_2$ filter stack, i.e., a filter stack including non-hydrogenated silicon layers, instead of an Si:H/$SiO_2$ filter stack. Transmission spectra 710 and 711 at incidence angles of 0° and 30°, respectively, for this optical filter are plotted in FIG. 7E. The transmittance level within the passband of this optical filter is too low to be useful.

With reference to FIG. 8, a second exemplary optical filter is a narrower bandpass filter that is designed to transmit light at a wavelength of 825 nm over an incidence angle range of 0° to 20°. The second exemplary optical filter of FIG. 8 is comparable to the second conventional optical filter of FIG. 2, and some properties of the optical filters are compared in FIG. 8A. Design data for the AR coating of the second exemplary optical filter, which is the same as that of the first exemplary optical filter, are listed in FIG. 7B. Design data for the filter stack of the second exemplary optical filter are listed in FIG. 8B. The filter stack includes 25 layers, the AR coating includes 5 layers, and the total coating thickness is about 3.3 μm.

Figure 8C:
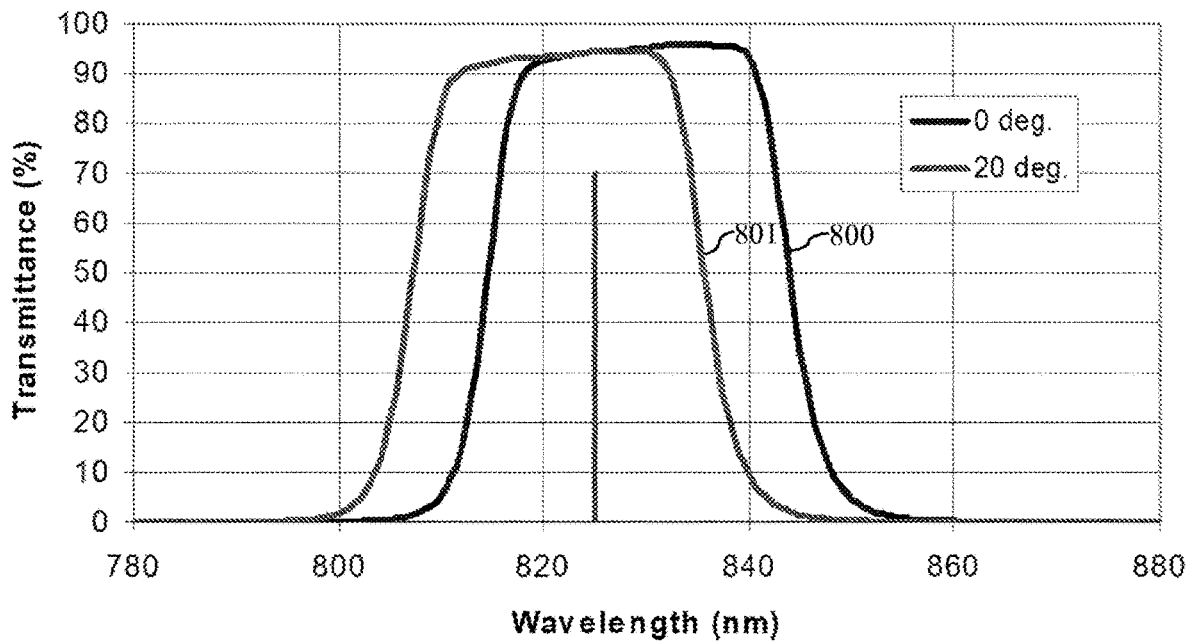
FIG. 8C is a plot of transmittance spectra at incidence angles of 0° and 20° for the second exemplary optical filter.
Figure 8D:
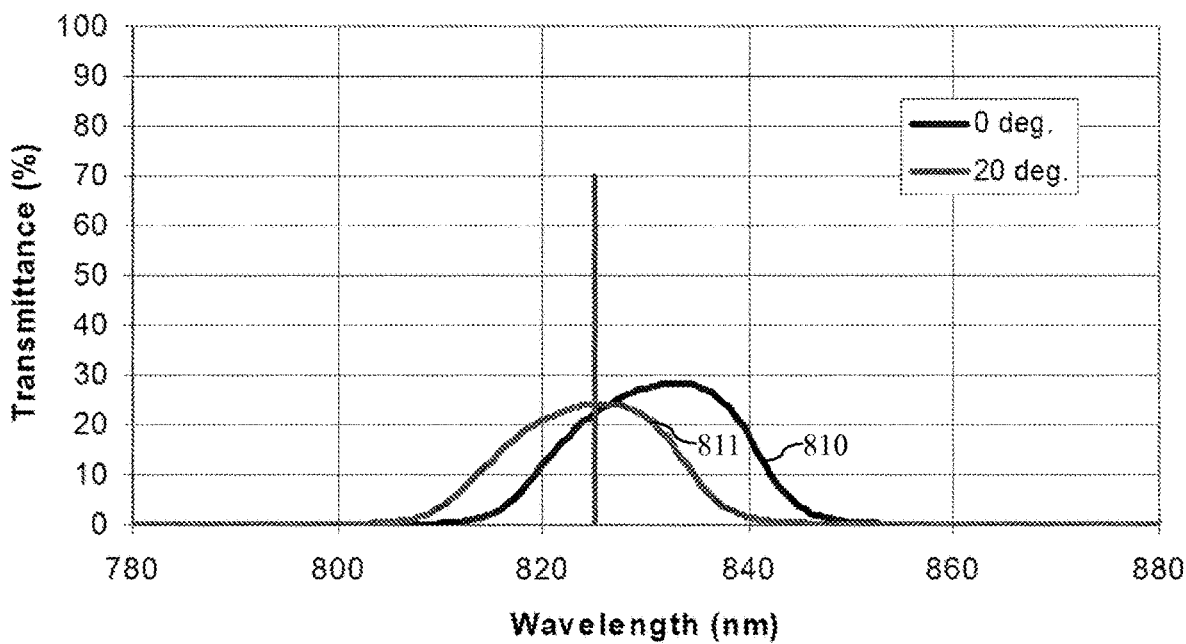
FIG. 8D is a plot of transmittance spectra at incidence angles of 0° and 20° for an optical filter analogous to the second exemplary optical filter, but including an Si/SiO$_2$ filter stack.

Transmission spectra 800 and 801 at incidence angles of 0° and 20°, respectively, for the second exemplary optical filter are plotted in FIG. 8C. The second exemplary optical filter has a transmittance level, within the passband, of greater than 90%, and a blocking level, outside of the passband, of greater than OD2 over a wavelength range of 400 nm to 1100 nm. The passband has a center wavelength of about 829 nm and a FWHM of about 29.6 nm at an incidence angle of 0°. With change in incidence angle from 0° to 20°, the center wavelength of the passband shifts by about −7.8 nm.

Figure 2:
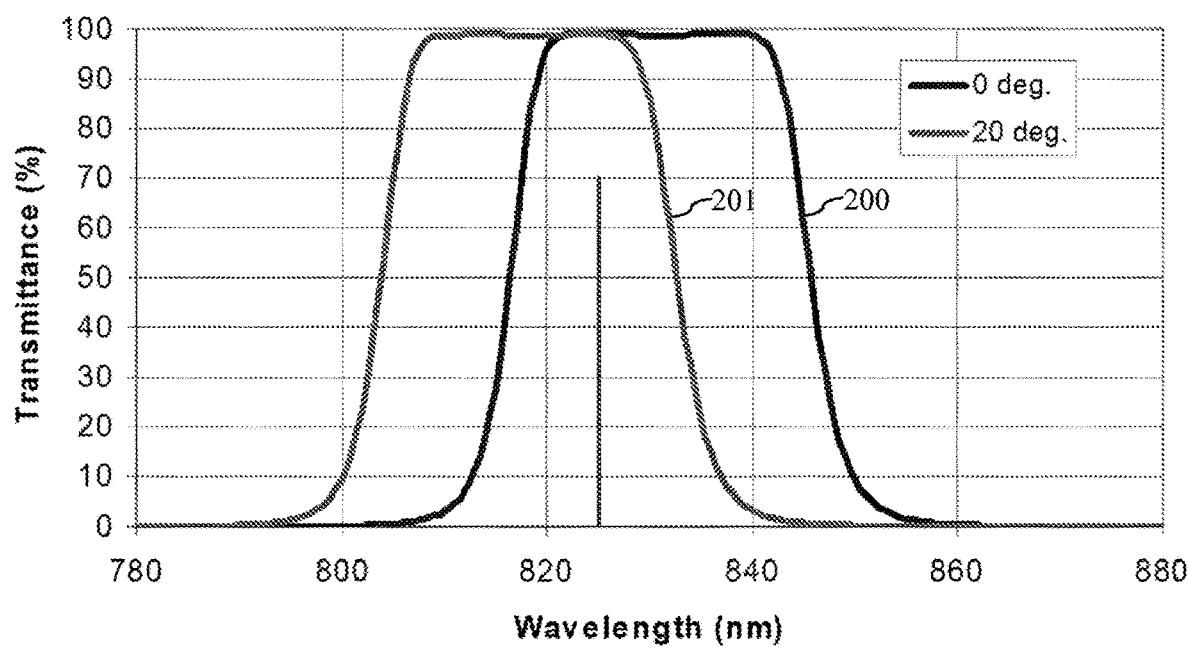
FIG. 2 is a plot of transmittance spectra at incidence angles of 0° and 20° for a second conventional optical filter.

Similarly to the first exemplary optical filter of FIG. 7, the second exemplary optical filter of FIG. 8, advantageously, includes fewer layers, has a smaller total coating thickness, and has a lower center-wavelength shift with change in incidence angle than the second conventional optical filter of FIG. 2.

The second exemplary optical filter may also be compared to an analogous optical filter including an Si/SiO$_2$ filter stack instead of an Si:H/SiO$_2$ filter stack. Transmission spectra 810 and 811 at incidence angles of 0° and 20°, respectively, for this optical filter are plotted in FIG. 8D. The transmittance level within the passband of this optical filter is too low to be useful.

Figure 3:
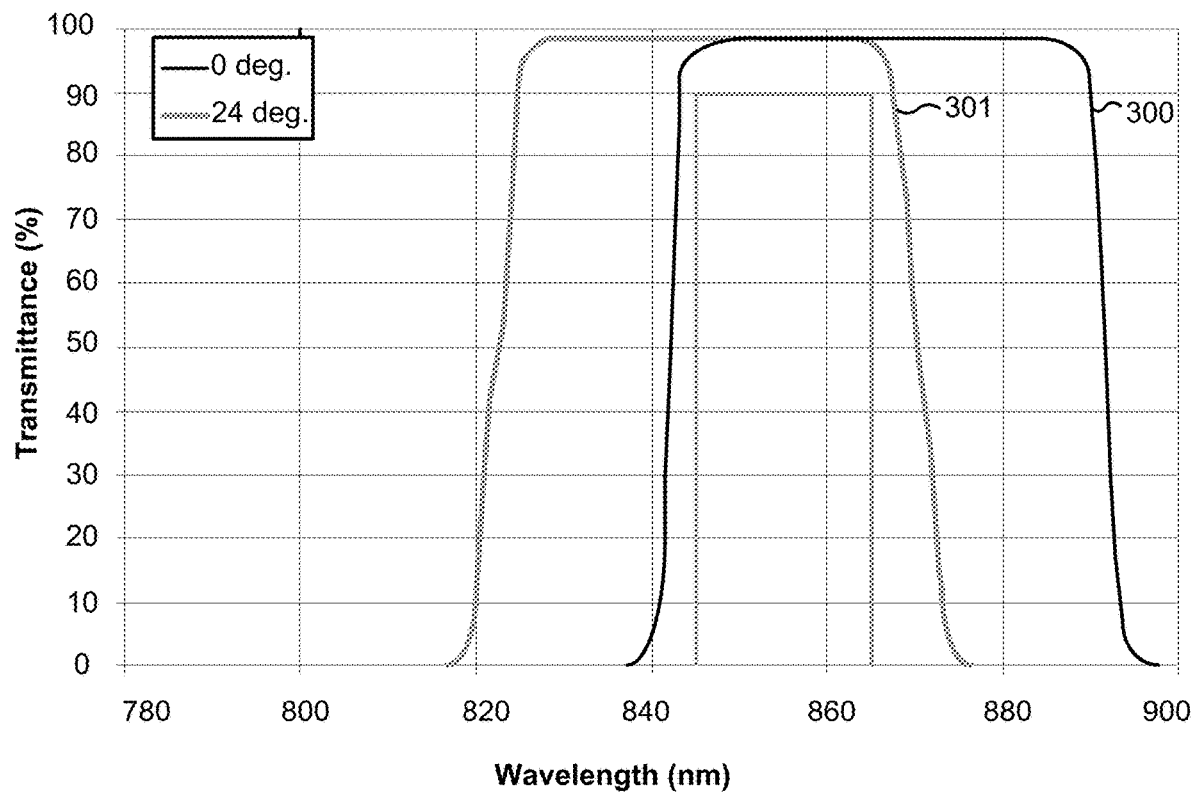
FIG. 3 is a plot of transmittance spectra at incidence angles of 0° and 24° for a third conventional optical filter.

With reference to FIG. 9, a third exemplary optical filter is a narrow bandpass filter that is designed to transmit light over a wavelength range of 845 nm to 865 nm over an incidence angle range of 0° to 40°. The third exemplary optical filter of FIG. 9 is comparable to the third conventional optical filter of FIG. 3. Design data for the AR coating of the third exemplary optical filter, which is the same as that of the first exemplary optical filter, are listed in FIG. 7B. Design data for the filter stack of the third exemplary optical filter are listed in FIG. 9A. The filter stack includes 29 layers, the AR coating includes 5 layers, and the total coating thickness is about 4.8 μm.

Figure 9B:
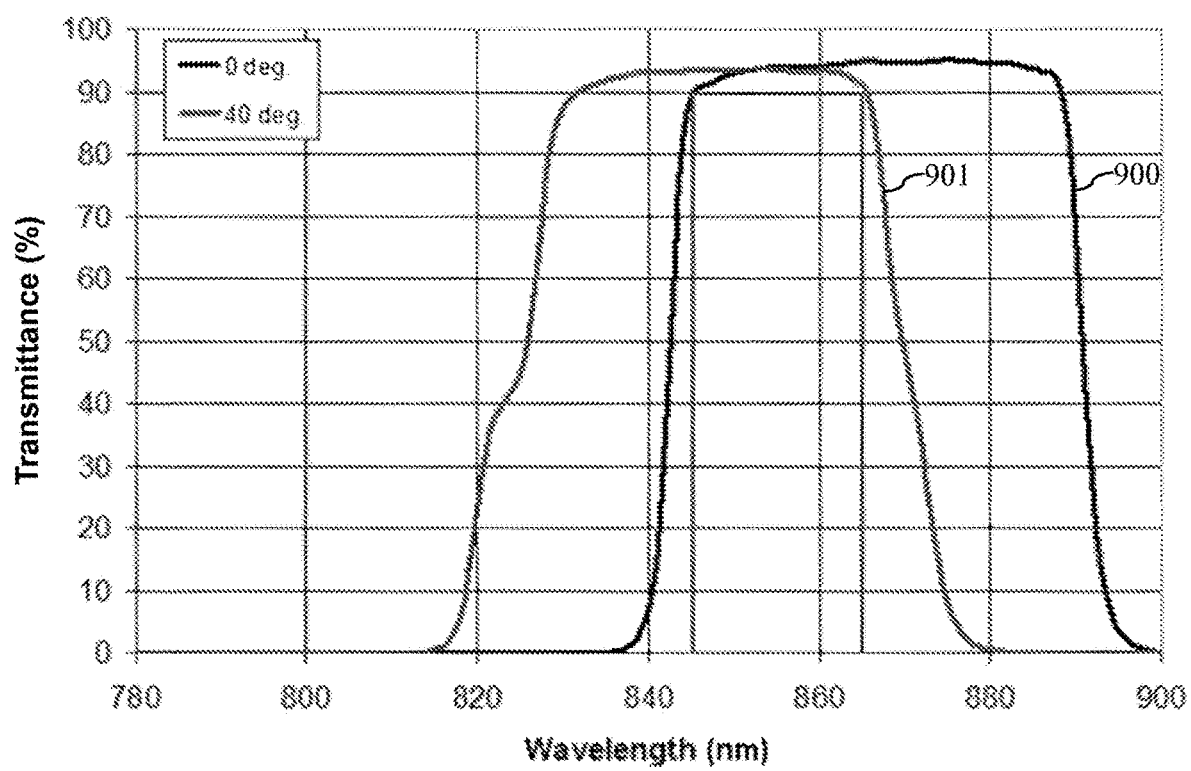
FIG. 9B is a plot of transmittance spectra at incidence angles of 0° and 40° for the third exemplary optical filter.

Transmission spectra 900 and 901 at incidence angles of 0° and 40°, respectively, for the third exemplary optical filter are plotted in FIG. 9B. The third exemplary optical filter of FIG. 9 has substantially the same passband width as the third conventional optical filter of FIG. 3, but has a slightly lower transmittance level within the passband. Advantageously, however, the third exemplary optical filter accepts light over a considerably larger incidence angle range of 0° to 40° than the third conventional optical filter, which accepts light over an incidence angle range of only 0° to 24°. In other words, the third exemplary optical filter has a significantly wider incidence-angle acceptance range. Also advantageously, the third exemplary optical filter includes fewer layers and has a smaller total coating thickness, about one fifth of the total coating thickness of the third conventional optical filter.

Figure 10:
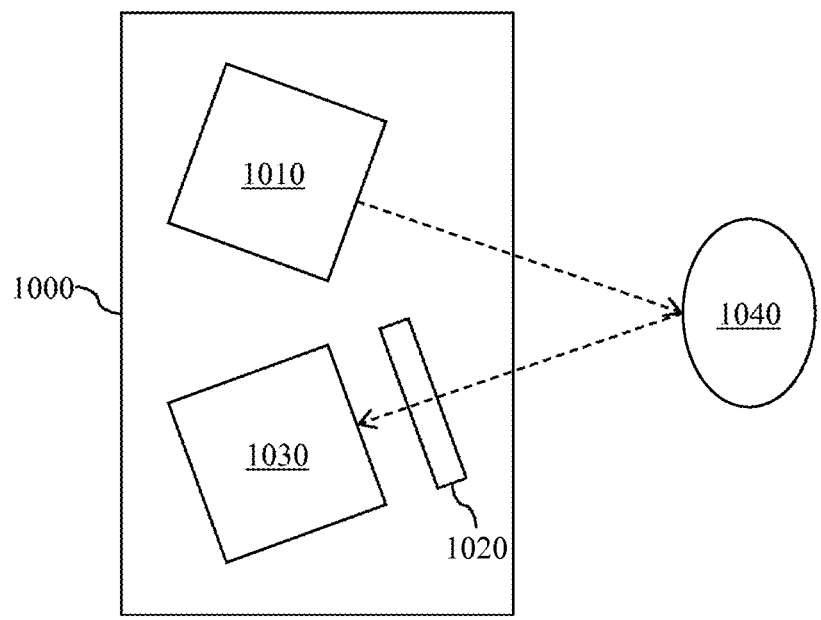
FIG. 10 is a block diagram of a sensor system according to the present invention.

As mentioned heretofore, the optical filter of the present invention is particularly useful when it forms part of a sensor system, such as a proximity sensor system, a 3D imaging system, or a gesture-recognition system. With reference to FIG. 10, a typical sensor system 1000 includes a light source 1010, an optical filter 1020 according to the present invention, and a sensor 1030. Note that other elements commonly included in a sensor system, such as optics, are omitted for simplicity of illustration.

The light source 1010 emits light at an emission wavelength in a wavelength range of 800 nm to 1100 nm. Typically, the light source 1010 emits modulated light, e.g., light pulses. Preferably, the light source 1010 is a light-emitting diode (LED), an LED array, a laser diode, or a laser diode array. The light source 1010 emits light towards a target 1040, which reflects the emitted light back towards the sensor system 1000. When the sensor system 1000 is a gesture-recognition system, the target 1040 is a user of the gesture-recognition system.

The optical filter 1020 is disposed to receive the emitted light after reflection by the target 1040. The optical filter 1020 has a passband including the emission wavelength and at least partially overlapping with the wavelength range of 800 nm to 1100 nm. Typically, the optical filter 1020 is a bandpass filter, preferably, a narrow bandpass filter, as described heretofore. The optical filter 1020 transmits the emitted light from the light source 1010, while substantially blocking ambient light. In short, the optical filter 1020 receives the emitted light from the light source 1010, after reflection by the target 1040, and transmits the emitted light to the sensor 1030.

The sensor 1030 is disposed to receive the emitted light after transmission by the optical filter 1020, i.e., the sensor 1030 is disposed behind the optical filter 1020. In some instances, the optical filter 1020 is formed directly on the sensor 1030 and, thus, disposed on the sensor 1030. For example, the optical filter 1020 may be coated and patterned, e.g., by photolithography, on sensors, e.g., proximity sensors, in wafer level processing (WLP).

When the sensor system 1000 is a proximity sensor system, the sensor 1030 is a proximity sensor, which detects the emitted light to sense a proximity of the target 1040, according to methods known in the art. When the sensor system 1000 is a 3D-imaging system or a gesture-recognition system, the sensor 1030 is a 3D image sensor, e.g., a charge-coupled device (CCD) chip or a complementary metal oxide semiconductor (CMOS) chip, which detects the emitted light to provide a 3D image of the target 1040, which, in some instances, is the user. Typically, the 3D image sensor converts the optical information into an electrical signal for processing by a processing system, e.g., an application-specific integrated circuit (ASIC) chip or a digital signal processor (DSP) chip, according to methods known in the art. For example, when the sensor system 1000 is a gesture-recognition system, the processing system processes the 3D image of the user to recognize a gesture of the user.

Of course, numerous other embodiments may be envisaged without departing from the spirit and scope of the invention.

We claim:

1. An optical device, comprising:
   a near infrared band pass filter, comprising:
   a substrate having a first side and a second side;
   a first set of layers on the first side, wherein the first set of layers includes silicon and hydrogen;
   a second set of layers on the first side, wherein the second set of layers includes oxygen; and
   a third set of layers on the second side, whether the third set of layers includes oxygen.

2. The optical device of claim 1, wherein one or both of the second set or the third set of layers includes silicon.

3. The optical device of claim 1, wherein one or both of the second set or the third set of layers is silicon dioxide.

4. The optical device of claim 1, wherein one or both of the second set or the third set of layers includes tantalum.

5. The optical device of claim 1, wherein one or both of the second set or the third set of layers includes titanium.

6. The optical device of claim 1, wherein total quantity of layers on the first side is between 25 and 48.

7. The optical device of claim 1, wherein the optical device is configured for use in a 3D image sensing system.

8. The optical device of claim 1, wherein the band pass filter has a center wavelength that shifts less than 15 nm in magnitude with a change in incidence angle from 0° to 30°.

9. An optical device, comprising:
   a first set of layers including silicon and hydrogen; and
   a second set of layers including oxygen;

wherein the optical device is a near infrared bandpass filter that has a center wavelength that shifts by less than 15 nm in magnitude with a change in incidence angle from 0° to 30°.

10. The optical device of claim 9, wherein the second set of layers includes silicon.

11. The optical device of claim 9, wherein the second set of layers is silicon dioxide.

12. The optical device of claim 9, wherein the second set of layers includes tantalum.

13. The optical device of claim 9, wherein the near infrared band pass filter has a full width half maximum (FWHM) that is less than 50 nm.

14. The optical device of claim 9, wherein the passband shifts by less than 13 nm in magnitude with a change in incidence angle from 0° to 30°.

15. An optical system, comprising:
   a light source for emitting light having a wavelength between 800-1100 nm; and
   a filter comprising:
      a first set of layers including silicon and hydrogen; and
      a second set of layers including oxygen;
   wherein the filter is designed for substantially allowing light in a wavelength range that includes the wavelength between 800-1100 nm to pass through it and exhibits a blocking level greater than OD2 between 400 nm to 1100 nm but outside of the wavelength range.

16. The optical system of claim 15, wherein the filter has a blocking level of greater than OD3 for wavelengths between 300 nm to 1100 nm that are outside of the wavelength range.

17. The optical system of claim 15, wherein the filter has a center wavelength that shifts by less than 20 nm in magnitude with a change in incidence angle from 0° to 30°.

18. The optical system of claim 15, wherein the first set of layers and the second set of layers are on a first side of a substrate and an antireflective coating is on a second side of the substrate.

19. The optical system of claim 15, wherein the first set of layers and the second set of layers are on a first side of a substrate and a third set of layers that includes oxygen is on a second side of the substrate.

* * * * *

(12) INTER PARTES REVIEW CERTIFICATE (3804th)
United States Patent
Hendrix et al.

(10) Number: US 11,131,794 K1
(45) Certificate Issued: Nov. 12, 2024

(54) OPTICAL FILTER AND SENSOR SYSTEM

(71) Applicants: Karen Denise Hendrix; Richard A. Bradley, Jr.; Georg J. Ockenfuss; Marius Grigonis

(72) Inventors: Karen Denise Hendrix; Richard A. Bradley, Jr.; Georg J. Ockenfuss; Marius Grigonis

(73) Assignee: VIAVI SOLUTIONS INC.

Trial Number:
IPR2022-01489 filed Sep. 6, 2022

Inter Partes Review Certificate for:
Patent No.: 11,131,794
Issued: Sep. 28, 2021
Appl. No.: 16/290,612
Filed: Mar. 1, 2019

The results of IPR2022-01489 are reflected in this inter partes review certificate under 35 U.S.C. 318(b).

INTER PARTES REVIEW CERTIFICATE
U.S. Patent 11,131,794 K1
Trial No. IPR2022-01489
Certificate Issued Nov. 12, 2024

AS A RESULT OF THE INTER PARTES REVIEW PROCEEDING, IT HAS BEEN DETERMINED THAT:

Claims 1-19 are cancelled.

\* \* \* \* \*